United States Patent
Koyanagi

(10) Patent No.: US 6,791,482 B2
(45) Date of Patent: Sep. 14, 2004

(54) METHOD AND APPARATUS FOR COMPRESSION, METHOD AND APPARATUS FOR DECOMPRESSION, COMPRESSION/ DECOMPRESSION SYSTEM, RECORD MEDIUM

(75) Inventor: Yukio Koyanagi, Saitama (JP)

(73) Assignee: Yasue Sakai, Saitama (JP)

( * ) Notice: Subject to any disclaimer, the term of this patent is extended or adjusted under 35 U.S.C. 154(b) by 166 days.

(21) Appl. No.: 10/275,117

(22) PCT Filed: Mar. 1, 2001

(86) PCT No.: PCT/JP01/01558

§ 371 (c)(1),
(2), (4) Date: Nov. 1, 2002

(87) PCT Pub. No.: WO92/071623

PCT Pub. Date: Sep. 12, 2002

(65) Prior Publication Data

US 2004/0027260 A1 Feb. 12, 2004

(51) Int. Cl.⁷ ............................. H03M 7/00; H03M 7/30
(52) U.S. Cl. .............................. 341/61; 341/87; 341/67
(58) Field of Search .......................... 341/143, 61, 50, 341/67, 65, 155, 87

(56) References Cited

U.S. PATENT DOCUMENTS 5,347,305 A * 9/1994 Bush et al. .............. 348/14.01
6,256,628 B1 * 7/2001 Dobson et al. ................. 707/6
6,657,567 B2 * 12/2003 Koyanagi ...................... 341/60
2003/0088404 A1 * 5/2003 Koyanagi .................... 704/215
2003/0216925 A1 * 11/2003 Koyanagi .................... 704/500

FOREIGN PATENT DOCUMENTS

| JP | 59096513 A | 6/1984 |
|---|---|---|
| JP | 03192400 A | 8/1991 |
| JP | 04061509 A | 9/1992 |
| JP | 10126275 A | 5/1998 |

* cited by examiner

Primary Examiner—Peguy JeanPierre
(74) Attorney, Agent, or Firm—Connolly Bove Lodge & Hutz LLP; Larry J. Hume

(57) ABSTRACT

On a compression side, from an inputted analog signal 101, points 102a to 102f where a differential absolute value is at a predetermined value or smaller are detected as sample points, and a pair of discrete amplitude data on the sample points and timing data indicative of a time interval between sample points is obtained as compressed data. On an expansion side, amplitude data and timing data that are included in the compressed data are used to obtain expansion data by determining interpolation data for interpolating two pieces of amplitude data, based on the two pieces of amplitude data on two successive sample points and timing data therebetween. Thus, when a signal on a time base is compressed and expanded, the operation can be performed on a time base without frequency conversion.

52 Claims, 31 Drawing Sheets

| r1 | r2 | r3 | r4 | r5 | r6 | r7 | r8 | r9 | r10 | r11 | r12 | r13 | Sout |
|---|---|---|---|---|---|---|---|---|---|---|---|---|---|
| 0 | 0 | 0 | 0 | 0 | 0 | 0 | 0 | 0 | 0 | 0 | 0 | 0 | 7 |
| 4 | 0 | 0 | 0 | 0 | 4 | 0 | 0 | 0 | 0 | 4 | 0 | 4 | 6.92 |
| 4 | 4 | 0 | 0 | 0 | 8 | 4 | 0 | 0 | 0 | 12 | 4 | 16 | 6.68 |
| 4 | 4 | 4 | 0 | 0 | 12 | 8 | 4 | 0 | 0 | 24 | 12 | 36 | 6.28 |
| 4 | 4 | 4 | 4 | 0 | 16 | 12 | 8 | 4 | 0 | 40 | 24 | 64 | 5.72 |
| 4 | 4 | 4 | 4 | 4 | 20 | 16 | 12 | 8 | 4 | 60 | 40 | 100 | 5 |
| 4 | 4 | 4 | 4 | 4 | 20 | 20 | 16 | 12 | 8 | 76 | 60 | 136 | 4.28 |
| 4 | 4 | 4 | 4 | 4 | 20 | 20 | 20 | 16 | 12 | 88 | 76 | 164 | 3.72 |
| 4 | 4 | 4 | 4 | 4 | 20 | 20 | 20 | 20 | 16 | 96 | 88 | 184 | 3.32 |
| 4 | 4 | 4 | 4 | 4 | 20 | 20 | 20 | 20 | 20 | 100 | 96 | 196 | 3.08 |
| 4 | 4 | 4 | 4 | 4 | 20 | 20 | 20 | 20 | 20 | 100 | 100 | 200 | 3 |

F I G. 18
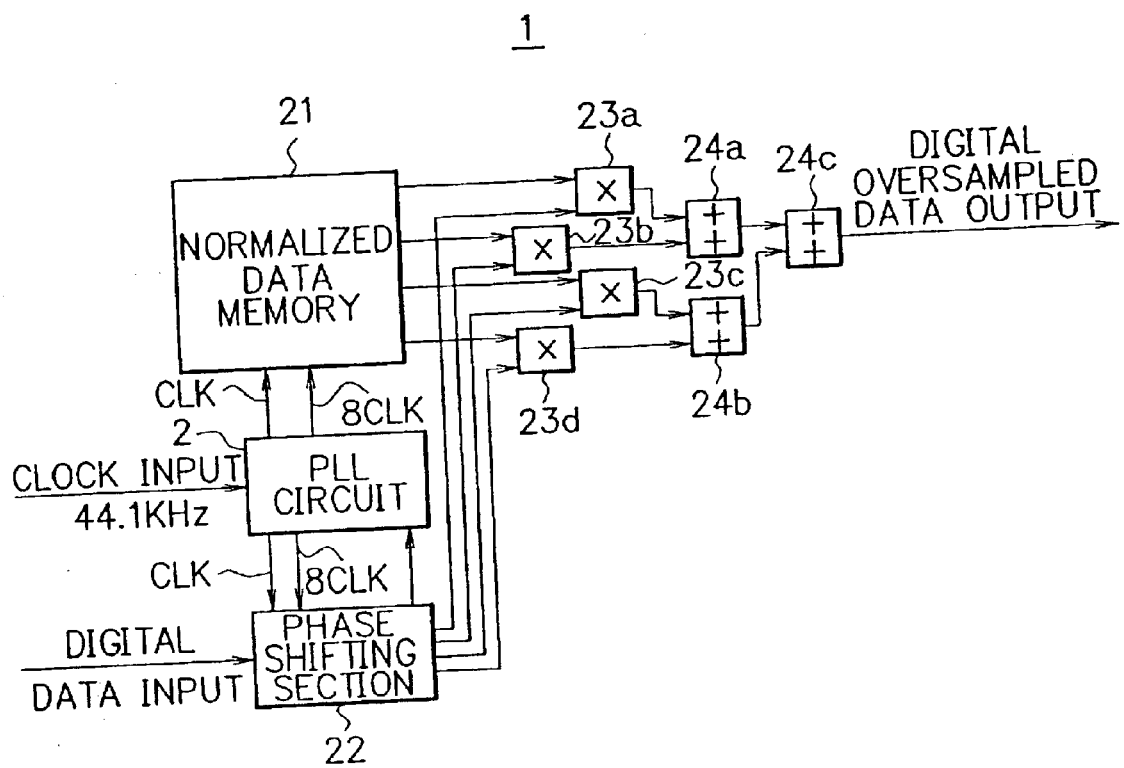

F I G. 25

| SAMPLE POINT | 1 | 2 | 3 | 4 | 5 | 6 | 7 | 8 | 9 | FINAL DATA |
|---|---|---|---|---|---|---|---|---|---|---|
| TIMING DATA | 6 | 23 | 11 | 29 | 24 | 9 | 9 | 17 | 3 | |
| AMPLITUDE DATA | 29.5 | 24.4 | 12 | 15.4 | 25.8 | 4.3 | 15.3 | 24.1 | 12.8 | 13.1 |

FIG. 32

| A RAW DATA Di WAVE DATA | B ROUND (Di/16.0) | C ROUND (Di/1024.0) | D DIFFER-ENTIATION | E FLUG 1 | F COMPRESSED AMPLITUDE DATA | G COMPRESSED AMPLITUDE DIFFERENCE DATA | H TIMING DATA | I DATA SWITCHING FLAG |
|---|---|---|---|---|---|---|---|---|
| 10746 | 672 | 10 | 672 | 0 | | | | |
| 11130 | 696 | 11 | 24 | 0 | | | | |
| 11310 | 707 | 11 | 11 | 1 | 11 | -1 | 2 | 0 |
| 10555 | 660 | 10 | -47 | 0 | 11 | -1 | 2 | 0 |
| 10325 | 645 | 10 | -15 | 0 | 11 | -1 | 2 | 0 |
| 10646 | 665 | 10 | 20 | 1 | 10 | 0 | 3 | 1 |
| 9986 | 624 | 10 | -41 | 0 | 10 | -3 | 3 | 0 |
| 8302 | 519 | 8 | -105 | 0 | 10 | -3 | 3 | 0 |
| 7093 | 443 | 7 | -76 | 0 | 10 | -3 | 3 | 0 |
| 7333 | 458 | 7 | 15 | 1 | 10 | 0 | 2 | 1 |
| 7513 | 470 | 7 | 12 | 1 | 7 | -1 | 2 | 0 |
| 6646 | 415 | 6 | -55 | 0 | 7 | -1 | 2 | 0 |
| 6861 | 429 | 7 | 14 | 0 | 7 | -1 | 2 | 0 |
| 7759 | 485 | 8 | 56 | 1 | 7 | 0 | 2 | 1 |
| 7555 | 472 | 7 | -13 | 0 | 6 | -2 | 3 | 0 |
| 6667 | 417 | 7 | -55 | 0 | 6 | -2 | 3 | 0 |
| 6297 | 394 | 6 | -23 | 0 | 6 | -2 | 3 | 0 |
| 7336 | 459 | 7 | 65 | 1 | 6 | 0 | 2 | 1 |
| 7779 | 486 | 8 | 27 | 1 | 8 | 0 | 2 | 0 |
| 7730 | 483 | 8 | -3 | 0 | 8 | 1 | 2 | 0 |
| 8545 | 534 | 8 | 51 | 1 | 8 | 1 | 2 | 0 |
| 9059 | 566 | 9 | 32 | 1 | 9 | -9 | 1 | 1 |
| 8663 | 541 | 8 | -25 | 0 | 9 | -9 | 1 | 0 |
| 8180 | 511 | 8 | -30 | 0 | 9 | -9 | 1 | 0 |
| 7847 | 490 | 8 | -21 | 0 | 9 | -9 | 1 | 0 |
| 6419 | 401 | 6 | -89 | 0 | 9 | -9 | 1 | 0 |
| 4792 | 300 | 5 | -101 | 0 | 9 | -9 | 1 | 0 |

FIG. 36

| A<br>COMPRESSED AMPLITUDE DIFFERENCE DATA | B<br>FIRST INTEGRATION DIFFERENCE DATA | C<br>SECOND INTEGRATION DIFFERENCE DATA | D<br>FIRST SHIFT | E<br>ADDITION | F<br>=ROUND(((N/(G+G+2)+F))*1024.0) | G<br>INTERPOLATION ORIGINAL DATA |
|---|---|---|---|---|---|---|
| −1 | −1 | −1 | 0 | −1 | 11136 | 11310 |
| −1 | −2 | −3 | −1 | −4 | 10752 | 10933 |
| 1 | −1 | −4 | −3 | −7 | 10368 | 10555 |
| 1 | 0 | −4 | −4 | −8 | 10240 | 10440 |
| 0 | 0 | 0 | 0 | 0 | 10240 | 10325 |
| 0 | 0 | 0 | 0 | 0 | 10240 | 10486 |
| −3 | −3 | −3 | 0 | −3 | 10069 | 10646 |
| −3 | −6 | −9 | −3 | −12 | 9557 | 10316 |
| −3 | −9 | −18 | −9 | −27 | 8704 | 9986 |
| 3 | −6 | −24 | −18 | −42 | 7851 | 9144 |
| 3 | −3 | −27 | −24 | −51 | 7339 | 8302 |
| 3 | 0 | −27 | −27 | −54 | 7168 | 7698 |
| 0 | 0 | 0 | 0 | 0 | 7168 | 7093 |
| 0 | 0 | 0 | 0 | 0 | 7168 | 7213 |
| 0 | 0 | 0 | 0 | 0 | 7168 | 7333 |
| 0 | 0 | 0 | 0 | 0 | 7168 | 7423 |
| −1 | −1 | −1 | 0 | −1 | 6656 | 7513 |
| 1 | 0 | −1 | −1 | −2 | 6144 | 7080 |
| 2 | 2 | 2 | 0 | 2 | 6400 | 6646 |
| 2 | 4 | 6 | 2 | 8 | 7168 | 6754 |
| −2 | 2 | 8 | 6 | 14 | 7936 | 6861 |
| −2 | 0 | 8 | 8 | 16 | 8192 | 7310 |
| −2 | −2 | −2 | 0 | −2 | 8078 | 7759 |
| −2 | −4 | −6 | −2 | −8 | 7737 | 7657 |
| −2 | −6 | −12 | −6 | −18 | 7168 | 7555 |
| 2 | −4 | −16 | −12 | −28 | 6599 | 7111 |
| 2 | −2 | −18 | −16 | −34 | 6258 | 6667 |
| 2 | 0 | −18 | −18 | −36 | 6144 | 6482 |
| 2 | 2 | 2 | 0 | 2 | 6400 | 6297 |
| 2 | 4 | 6 | 2 | 8 | 7168 | 6817 |
| −2 | 2 | 8 | 6 | 14 | 7936 | 7336 |
| −2 | 0 | 8 | 8 | 16 | 8192 | 7558 |
| 0 | 0 | 0 | 0 | 0 | 8192 | 7779 |
| 0 | 0 | 0 | 0 | 0 | 8192 | 7755 |
| 1 | 1 | 1 | 0 | 1 | 8320 | 7730 |
| 1 | 2 | 3 | 1 | 4 | 8704 | 8138 |
| −1 | 1 | 4 | 3 | 7 | 9088 | 8545 |
| −1 | 0 | 4 | 4 | 8 | 9216 | 8802 |
| −9 | −9 | −9 | 0 | −9 | 9178 | 9059 |
| −9 | −18 | −27 | −9 | −36 | 9064 | 8861 |
| −9 | −27 | −54 | −27 | −81 | 8873 | 8663 |
| −9 | −36 | −90 | −54 | −144 | 8607 | 8422 |
| −9 | −45 | −135 | −90 | −225 | 8264 | 8180 |
| −9 | −54 | −189 | −135 | −324 | 7845 | 8014 |
| −9 | −63 | −252 | −189 | −441 | 7350 | 7847 |
| −9 | −72 | −324 | −252 | −576 | 6779 | 7133 |
| −9 | −81 | −405 | −324 | −729 | 6131 | 6419 |
| −9 | −90 | −495 | −405 | −900 | 5408 | 5606 |

METHOD AND APPARATUS FOR COMPRESSION, METHOD AND APPARATUS FOR DECOMPRESSION, COMPRESSION/DECOMPRESSION SYSTEM, RECORD MEDIUM

BACKGROUND OF THE INVENTION

1. Field of the Invention

The present invention relates to method and apparatus for compression, method and apparatus for decompression, compression/decompression system, and record medium, particularly to a method for compression and decompression a continuous analog signal or digital signal.

2. Description of the Related Art

Conventionally, when transmitting and storing a signal such as a picture signal and an aural signal that has a large amount of information, a signal has been compressed and expanded in order to reduce an amount of transmitted information, increase a storing time of a storage medium, and so on. Generally, when an analog signal is compressed, an analog signal is initially sampled according to a predetermined sampling frequency and is digitized, and compression is performed on the obtained digital data.

For example, in the case of compression on a picture signal and an aural signal, a method is used in which compression is performed on a frequency region after original data is processed using a conversion filter on a time base-frequency axis such as DCT (Discrete-Cosine-Transform). DPCM (Differential Pulse Code Modulation), which is frequently used as a method of compression an aural signal for a telephone line, is used with the same intention. Additionally, the DPCM compression is a method for coding a difference of adjacent sample values when a waveform is sampled.

Further, as a method for performing time/frequency conversion, a method using a sub-band filter and MDCT (Modified Discrete Cosine Transform) is also available. As a coding method using such a method, MPEG (Moving Picture Image Coding Experts Group) audio is applicable.

Further, the most widely used picture compression system is generally known as the MPEG standard.

Data compressed by the above compression method is basically expanded according to reversed operations of the same compression method.

Namely, after compressed digital data is converted from a signal of a frequency region to a signal of a time region by frequency/time conversion, predetermined decompression operations are carried out to reproduce original digital data. And then, the original data obtained thus is subjected to digital-analog conversion if necessary and is outputted as an analog signal.

However, in the above conventional compression and decompression method, a signal on a time base is converted to a signal on a frequency axis before compression. Hence, operations such as time/frequency conversion for compression and frequency/time conversion for expansion are necessary. Therefore, the operations are complicated and the configuration for realizing the operations becomes extremely complicated. This problem has caused not only a longer processing time for compression and expansion but also difficulty in achieving a smaller device.

Moreover, generally in the case of compression and expansion of data, it is important to consider how to improve the quality of reproduced data while improving its compressibility. However, in the above conventional compression and decompression method, when a compressibility of a picture signal and an aural signal is increased, an image and voice reproduced by decompression compressed data are degraded in quality. In contrast, when importance is placed on the quality of a reproduced image and reproduced voice, a picture signal and an aural signal decreases in compressibility. Therefore, it has been extremely difficult to achieve both of an increased compressibility and improved quality of reproduced data.

The present invention is devised to solve the above problems and aims to simplify the compression and decompression operations for a signal so as to shorten a processing time and to simplify the configuration for realizing the operations.

Also, another object of the present invention is to provide a new compression and decompression method for increasing compressibility and improving quality of reproduced data.

Furthermore, another object of the present invention is to more readily perform compression and expansion without using a table.

SUMMARY OF THE INVENTION

In order to solve the above-mentioned problems, on a compression side of the first invention, a signal to be compressed is sampled at a time interval of a point where a differential absolute value is at a predetermined value or smaller, a pair of discrete amplitude data on each sample point and timing data indicative of a time interval between sample points is obtained as compressed data.

Here, a signal to be compressed may be oversampled, and the oversampled data may be sampled at a time interval of a point where a differential absolute value is at a predetermined value or smaller. Further, on the oversampled data, the operation for generating average value data of successive sample values may be further performed.

Moreover, on an expansion side of the first invention, regarding compressed data composed of a pair of amplitude data on predetermined sample points extracted from a signal to be compressed and timing data indicative of a time interval between sample points, amplitude data on successive sample points and timing data therebetween are used to obtain interpolation data for interpolating pieces of amplitude data having a time interval indicated by the timing data. Thus, expansion data is obtained.

Here, a sampling function obtained from two pieces of amplitude data on two successive sample points and timing data therebetween may be used to obtain interpolation data for interpolating the two pieces of amplitude data.

According to the first invention configured thus, when a signal is compressed on a time base, the operation can be performed on a time base without performing time/frequency conversion on a frequency axis. Besides, when data compressed thus is expanded as well, the operation can be performed on a time base. Therefore, it is possible to simplify compression and expansion, to shorten an operating time, and to simplify the configuration for the operations. Also, when compressed data is transmitted from the compression side and is reproduced on the expansion side, a simple interpolating operation on a time base can sequentially process and reproduce compressed data inputted to the expansion side, thereby realizing real-time operations.

Besides, in the present embodiment, only data on sample points of sampling points can be obtained as compressed data, thereby achieving high compressibility. The sample points are equivalent to inflected points in a signal to be compressed, and the sample points include all minimum points required for reproducing original data by an interpolating operation on the expansion side. Therefore, it is possible to obtain high-quality reproduced data with higher reproducibility of original data.

Further, on the compression side of the second invention, digital data of a basic waveform corresponding to values of inputted n pieces of discrete data is synthesized by oversampling and a moving average operation or a convoluting operation so as to obtain digital interpolation values for the discrete data. Thereafter, the digital interpolation values are sampled at a time interval of a point having a minimum differential absolute value, and a pair of discrete amplitude data on sample points and timing data indicative of a time interval between sample points is obtained as compressed data.

Moreover, on the expansion side of the second invention, by using amplitude data and timing data that are included in compressed data, based on two pieces of amplitude data on two successive sample points and timing data therebetween, interpolation data for interpolating the two pieces of amplitude data is determined so as to obtain expansion data.

According to the second invention configured thus, when data is compressed on a time base, the operation can be performed on a time base without performing time/frequency conversion on a frequency axis. Besides, when data compressed thus is expanded as well, the operation can be performed on a time base. Therefore, it is possible to simplify compression and expansion, to shorten an operating time, and to simplify the configuration for the operations. Also, when compressed data is transmitted from the compression side and is reproduced on the expansion side as well, a simple interpolating operation on a time base can sequentially process and reproduce compressed data inputted to the expansion side, thereby realizing real-time operations.

Besides, only data on sample points of sampling points can be obtained as compressed data, thereby achieving high compressibility. The sample points are equivalent to inflected points in a signal to be compressed, and the sample points include all minimum points required for reproducing original data by an interpolating operation on the expansion side. Therefore, it is possible to obtain high-quality reproduced data with higher reproducibility of original data.

Additionally, according to the second invention, when an interpolation value is obtained by performing oversampling and convolution on digital data, only values of a limited number of pieces of discrete data need to be considered for determining a certain interpolation value, thereby preventing a censoring error. Thus, an interpolation value can be obtained accurately. Therefore, regarding data reproduced on the expansion side when compression is performed using the interpolation value, it is possible to improve reproducibility to original data before compression.

Besides, on the compression side of the third invention, inputted digital data is differentiated, a point where a differential value changes in polarity is detected as a sample point, and digital data rounded by a predetermined value is obtained as discrete compressed amplitude data on sample points. A pair of compressed amplitude difference data, which is obtained by computing a difference between pieces of the compressed amplitude data, and timing data indicative of a time interval between sample points is obtained as compressed data.

Further, on the expansion side of the third invention, the compressed amplitude difference data, which is oversampled by even-numbered times, is subjected to multiple integral, and a moving average operation is performed on the integral value. A moving average value obtained thus and timing data is used to obtain square-law interpolation data, which interpolates pieces of amplitude data on sample points having a time interval indicated by the timing data, as expansion data.

In another aspect of the third invention, on the compression side, inputted digital data is rounded by a first value, the digital data rounded by the first value is differentiated and a point where a differential value changes in polarity is detected as a sample point. Digital data rounded by a second value, which is larger than the first value, is obtained as discrete compressed amplitude data on sample points.

In another aspect of the third invention, on the compression side, the compressed amplitude difference data and the timing data are converted to variable-length block data.

In another aspect of the third invention, on the expansion side, the compressed amplitude difference data oversampled by even-numbered times is reversed in sign at an intermediate position of each section between sample points, the section being indicated by the timing data. Data strings obtained thus are subjected to multiple integral.

In another aspect of the third invention, on the expansion side, multiple integral and a moving average operation are performed in each section between sample points on the compressed amplitude difference data oversampled by even-numbered times.

According to the third invention configured thus, when a signal on a time base is compressed, the operation can be performed on a time base without performing time/frequency conversion on a frequency axis. Besides, when data compressed thus is expanded as well, the operation can be performed on a time base. Therefore, it is possible to simplify compression and expansion, to shorten an operating time, and to simplify the configuration for the operations. Also, during expansion, a simple square-law interpolating operation on a time base can sequentially process and reproduce inputted compressed data without using table information, thereby realizing real-time operations.

Furthermore, according to the third invention, compressed data can be generated from only few pieces of discrete data that include an amplitude data value on a sample point where digital data has a differential value changing in polarity and a timing data value indicative of a time interval of sample points. Besides, since amplitude data on sample points is rounded by a predetermined value, it is possible to shorten a data length of amplitude data by several bits per word, thereby largely reducing an amount of data. Additionally, in the third invention, rounded amplitude data is not used as compressed data directly but difference data is further determined as compressed data. Hence, it is possible to further reduce the number of bits required for compressed data, thereby reducing an amount of data.

Moreover, according to other characteristics of the third invention, compressed amplitude difference data and timing data that are obtained thus are encoded to variable-length block data as final compressed data. Thus, compressibility can be further increased.

Besides, according to the third invention, an inflection point existing in a signal to be compressed is detected as a sample point, and compressed data includes all minimum points required for reproducing original data by an interpolating operation on the expansion side. Therefore, it is possible to increase reproducibility of original data, thereby obtaining high-quality reproduced data.

Additionally, according to another characteristic of the third invention, digital data rounded by a suitable value is differentiated to detect a sample point. Hence, it is possible to prevent positions of noise components and unnecessary signal components from being detected as sample points, thereby positively detecting only correct positions as sample points. Therefore, as for expansion data reproduced on the expansion side, it is possible to improve reproducibility of original data before compression.

Further, according to another characteristic of the third invention, compressed amplitude difference data oversampled by even-numbered times is reversed in sign at an intermediate position of each section between sample points. Hence, when multiple integral and a moving average operation are performed on data strings reversed in sign, it is possible to compensate for a rounding error on the compression side and to reproduce a digital waveform having more smoothly changing amplitude values.

Besides, according to another characteristic of the third invention, on the expansion side, multiple integral is performed in each section between sample points. Thus, it is possible to eliminate an accumulative error caused by integral, thereby reproducing a digital waveform more accurately.

BRIEF DESCRIPTION OF THE DRAWINGS

FIG. 16 is a diagram for explaining an example of the operation of oversampling and convolution according to Embodiment 2;

FIG. 18 is a diagram showing an example of the configuration of an oversampling circuit shown in FIG. 13;

FIG. 22 is a diagram showing an example of data outputted by passing oversampled data of FIG. 20 through the differentiator of FIG. 13;

FIG. 23 is an explanatory drawing showing the operation for the case where equal differential absolute values appear successively;

FIG. 25 is a diagram showing an example of compressed data outputted by passing the oversampled data of FIG. 20 through a compressed data generating section of FIG. 13;

FIG. 32 is a diagram for explaining an example of an actual compression operation performed by the compression apparatus of Embodiment 3;

FIG. 36 is a diagram for explaining an example of an actual decompression operation performed by the decompression apparatus of Embodiment 3.

DETAILED DESCRIPTION OF THE PREFERRED EMBODIMENTS

Hereinafter, an embodiment of the present invention will be discussed in accordance with the accompanied drawings.

(Embodiment 1)

Figure 1:
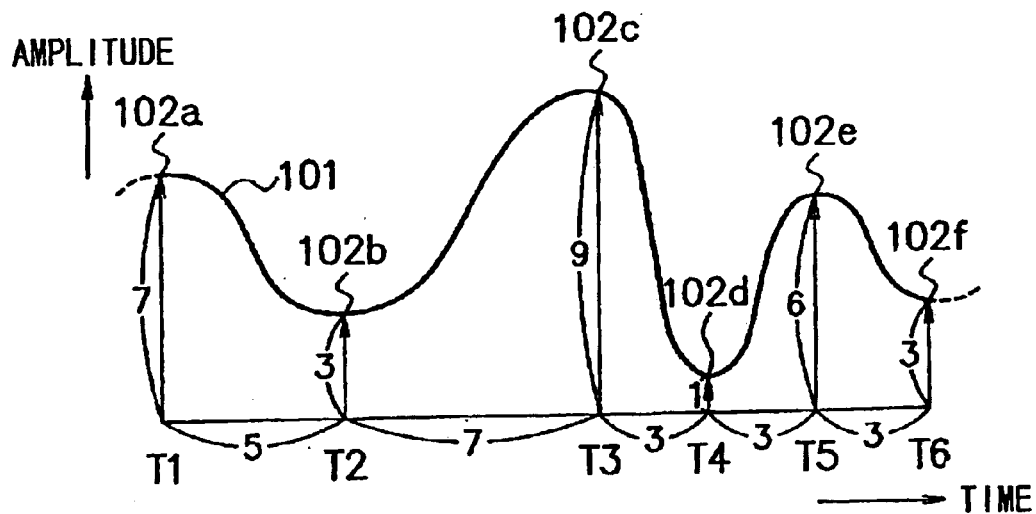
FIG. 1 is a diagram for explaining a compression method of Embodiment 1.
Figure 2:
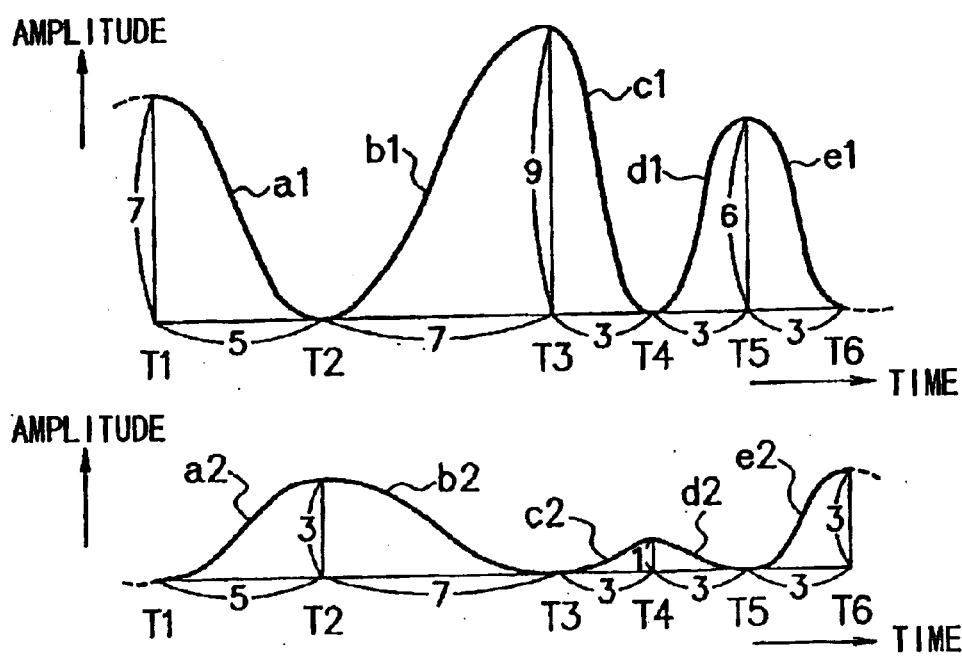
FIG. 2 is a diagram for explaining an decompression method of Embodiment 1.

FIG. 1 is a diagram for explaining a compression method of Embodiment 1 and showing an example of an input analog signal to be compressed. Further, FIG. 2 is a diagram for explaining an decompression method of the present embodiment.

First, referring to FIG. 1, the compression operation will be discussed. In the present embodiment, points 102a to 102f (hereinafter, referred to as sample points), on which differential absolute values (inclination of a signal) are at a predetermined value including "0" or smaller, are detected from an input analog signal 101. And then, digital data values, which are obtained by performing analog-digital conversion on amplitude of the sample points 102a to 102f, and timing data values, which are indicative of time intervals of the sample points 102a to 102f, are obtained. A pair of the amplitude data value and the timing data value is transmitted or recorded as compressed data.

In the example of FIG. 1, "7, 3, 9, 1, 6, 3" are obtained as digital amplitude data values on the sample points 102a to 102f, and "5, 7, 3, 3, 3" are obtained as timing data indicative of time intervals between time T1 and T2, time T2 and T3, time T3 and T4, time T4 and T5, and time T5 and T6 of the sample points 102a to 102f. Here, numbers shown as timing data indicate the number of clocks that depends upon a sampling frequency.

At time T1, an amplitude data value "7" on the sample point 102a and a timing data value (not shown), which is indicative of a time interval from when a sample point (not shown) is previously detected, are obtained. Thus, a pair of the data values is transmitted or recorded as compressed data of time T1.

Next, at time T2 when the sample point 102b is detected, a timing data value "5", which is indicative of a time interval from time T1 when the sample point 102a is previously detected, and an amplitude data value "3" on the sample point 102b are obtained. Thus, a pair of the data values (5, 3) is transmitted or recorded as compressed data of time T2.

Next, at time T3 when the sample point 102c is detected, a timing data value "7", which is indicative of a time interval from time T2 when the sample point 102b is previously detected, and an amplitude data value "9" on the sample point 102c are obtained. Thus, a pair of the data values (7, 9) is transmitted or recorded as compressed data of time T3.

In a similar manner, as compressed data of time T4, T5, and T6, (3, 1), (3, 6), and (3, 3), which are pairs of timing data values and amplitude data values, are transmitted or recorded. The timing data values are indicative of time intervals between time T3 and T4, time T4 and T5, and time T5 and T6, and the amplitude data values are detected on the sample points 102d, 102e, and 102f at time T4, T5, and T6.

Subsequently, referring to FIG. 2, the following will discuss an decompression operation of data compressed as shown in FIG. 1. When the input analog signal 101 is compressed according to the method of FIG. 1, a numeral series of (*, 7), (5,3), (7,9), (3,1), (3,6), and (3, 3) is obtained as compressed data. Here, * indicates that no value is shown in FIG. 1. Compressed data is inputted to an expansion side in the above order.

On the expansion side, data of a waveform a1 is generated by an interpolating operation from two data values of a firstly inputted amplitude data value "7" and a timing data value "5". Next, data of a waveform a2 is generated by interpolation from two data values of the above timing data value "5" and a subsequently inputted amplitude data value "3".

And then, from two data values of the above amplitude data value "3" and a subsequently inputted timing data value "7", data of a waveform b2 is generated by interpolation. Further, from the above timing data value "7" and a subsequently inputted amplitude data value "9", data of a waveform b1 is generated by interpolation. In a similar manner, from pairs of sequentially inputted amplitude data values and timing data values, data of waveforms c1, c2, d2, d1, e1, and e2 is generated sequentially.

The above operation produces a digital signal (upper stage of FIG. 2) having the waveforms a1, b1, c1, d1, and e1 continuously formed, and a digital signal (lower stage of FIG. 2) having the waveforms a2, b2, c2, d2, and e2 formed continuously. And then, the two digital signals produced thus are added to each other and are subjected to digital-analog conversion. Hence, the original analog signal of FIG. 1 is reproduced.

Figure 3A:
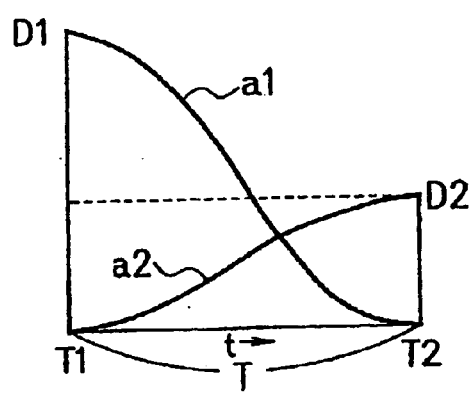
FIGS. 3A and 3B are diagrams showing an interpolating principle of the present embodiment by taking out the section between time T1 and T2 of FIG. 2.
Figure 3B:
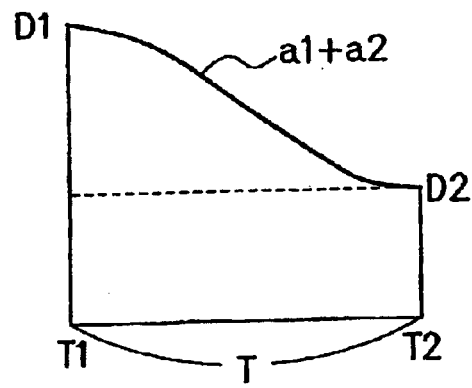

FIGS. 3A and 3B show a section between time T1 and T2 of FIG. 2. FIG. 3A shows the two waveforms a1 and a2 before addition. FIG. 3B shows a synthetic waveform a1+a2 reproduced by addition.

In FIG. 3A, reference numeral D1 denotes an amplitude data value ("7" in the example of FIG. 2) at time T1, reference numeral D2 denotes an amplitude data value ("3" in the example of FIG. 2) at time T2, reference character T denotes a timing data value ("5" in the example of FIG. 2) indicative of a time interval between time T1 and T2, and reference character t denotes arbitrary timing between time T1 and T2.

As shown in FIG. 3A, data of the waveform a1 is generated by interpolation using an amplitude data value D1 at time T1 and a timing data value T indicative of a time interval between time T1 and T2 while an arbitrary timing t between time T1 and T2 acts as a variable, that is, while a value of timing t is incremented one by one according to a clock based on a sampling frequency.

Moreover, data of the waveform a2 is generated by interpolation using an amplitude data value D2 at time T2 and a timing data value T indicative of a time interval between time T1 and T2 while the timing t similarly acts as a variable.

And then, pieces of data of the waveforms a1 and a2 generated thus are added to each other while the timing t acts as a variable. Hence, a waveform of FIG. 3B is synthesized. In this manner, the original analog signal before compression can be reproduced.

The following will discuss a principle of reproducing the original analog signal by the decompression operation using the above interpolation.

In general, in order to obtain a continuous analog signal from discrete digital data, interpolation is performed between pieces of digital data inputted in a discrete manner and a sampling frequency is increased artificially. Such data interpolation is normally performed using a predetermined sampling function.

Figure 4:
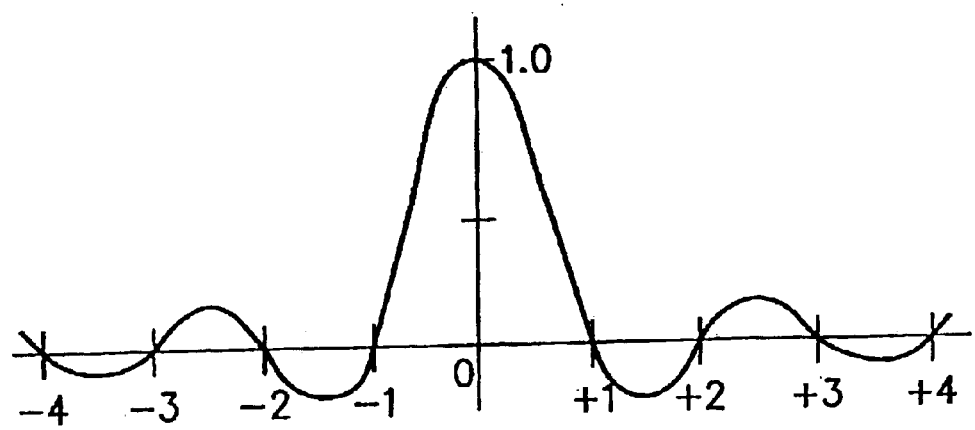
FIG. 4 is a diagram showing an example of a sampling function.

FIG. 4 shows an example of a sampling function. In the example of FIG. 4, a value is set at "1" only on a sampling point of t=0, and values are all set at "0" on other sampling points (t=±1, ±2, ±3, ±4, . . . ) having regular intervals.

Figure 5:
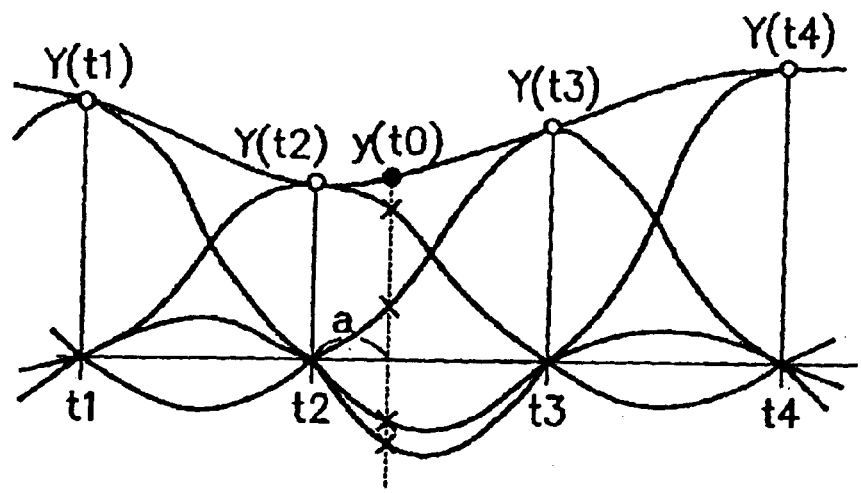
FIG. 5 is a diagram showing the relationship between pieces of discrete data and interpolation values therebetween.

FIG. 5 is a diagram for explaining a typical operation of data interpolation using such a sampling function. In FIG. 5, it is assumed that sampling points t1, t2, t3, and t4 at regular intervals respectively have discrete data values of $Y(t1)$, $Y(t2)$, $Y(t3)$, and $Y(t4)$ and, for example, an interpolation value y is determined, which corresponds to a predetermined position to (distance a from t2) between the sampling points t2 and t3.

In general, when an interpolation value y is obtained using a sampling function, a value of a sampling function on an interpolating position t0 is obtained for each of provided pieces of discrete data, and a convoluting operation is carried out using the values. To be specific, each of the sampling points t1 to t4 is caused to have an equal peak height at the center of a sampling function. A sampling function value (indicated by x) is computed for each of the sampling points at the interpolating position t0, and all the values are added.

Such interpolation is carried out while the interpolating position to is moved sequentially with the passage of time (in accordance with increment of a sampling clock). Thus, an interpolation value y (t0), which varies continuously, is computed in a sequential manner. Hence, it is possible to obtain a continuous analog signal for connecting pieces of discrete data smoothly.

The present embodiment applies such data interpolation. Namely, as shown in FIG. 3A, the waveform a1 is obtained, which forms a part of a sampling function having a value other than "0" on a first sample point (time T1), from an amplitude data value D1 (=7) and a timing data value T (=5) that have already been inputted at time T2. Further, the waveform a2 is obtained, which forms a part of a sampling function having a value other than "0" on a second sample point (time T2), from an amplitude data value D2 (=3) and a timing data value T (=5).

And then, the values of the waveforms a1 and a2 are added on each interpolating position t, which sequentially moves with the passage of time. Thus, it is possible to obtain a continuous analog signal for connecting discrete data D1 and D2 smoothly.

Besides, the present embodiment describes that pieces of data of the waveforms a1 and a2 are added to each other after they are obtained. It is also possible to obtain a synthetic waveform at one time by using a predetermined equation and so on because data for generating and synthesizing the waveforms a1 and a2 is all obtained at time T2.

Incidentally, in the present embodiment, as shown in FIG. 1, discrete data serving as compressed data is obtained by sampling the input analog signal 101, which varies smoothly, on the compression side at time intervals of points on which differential absolute values are at a predetermined value or smaller. Therefore, the sample points on which discrete data is obtained are not always evenly spaced and the intervals become irregular in many cases (in the example of FIG. 1 as well, the sample points are unevenly spaced in "5, 7, 3, 3, 3") Hence, on the expansion side of FIG. 2, for example, when an interpolation value between time T1 and T2 is computed, as shown in FIG. 3, the above convoluting operation is performed by using only sampling functions a1 and a2 at a time interval between the sample points of the time T1 and T2. Other sampling functions b1, b2, c1, c2, d1, d2, e1, and e2 having different time intervals between sample points are not taken into consideration when the convoluting operation is carried out.

Moreover, for example, when an interpolation value is computed between time T2 and T3, a convoluting operation is performed by using only sampling functions b1 and b2 at a time interval (=7) between sample points of time T2 and T3. Other sampling functions a1, a2, c1, c2, d1, d2, e1, and e2, which have different time intervals between sample points, are not taken into consideration when the convoluting operation is carried out. This holds true when interpolation values are obtained between other sample points.

Namely, in the compression/decompression system of the present embodiment, on the compression side, the input analog signal 101 varying smoothly is sampled at irregular time intervals having differential absolute values at a predetermined value or smaller. Thus, discrete amplitude data values and timing data values indicative of irregular time intervals are obtained as compressed data. Further, on the expansion side, according to the amplitude data values and the timing data values in compressed data, a continuous analog signal is generated, which connects pieces of discrete data at time intervals as irregular as the compression side, by interpolation using the above sampling functions.

Next, the following will discuss a specific example of the above data interpolation. As described above, for example, when an interpolation value is obtained between time T1 and T2, only the sampling functions a1 and a2 are used, which are obtained from amplitude data values in time T1 and T2 and a timing data value indicative of a time interval between time T1 and T2. Namely, data required for computing an interpolation value on each interpolating position t between time T1 and T2 is all obtained at time T2, so that it is possible to reproduce the original analog signal shown in FIG. 3B at this moment.

Figure 6:
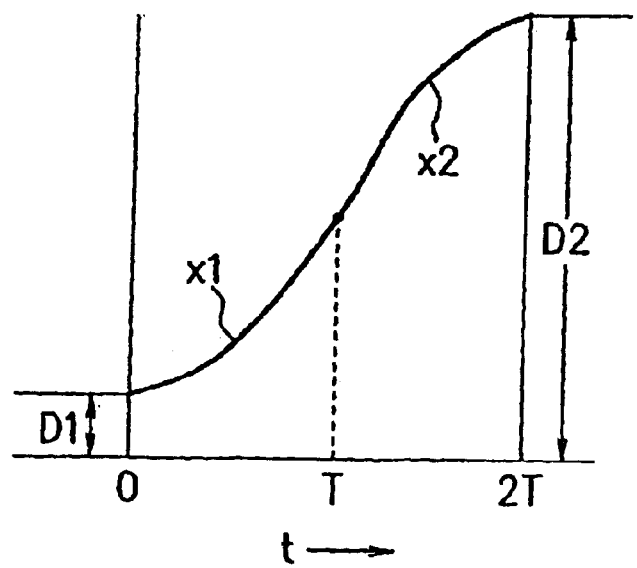
FIG. 6 is a diagram for explaining an interpolating equation, which is a specific example of data interpolation on the expansion side.

Therefore, in the present embodiment, every time two amplitude data values D1 and D2 and a timing data value T indicative of a time interval therebetween are obtained for each discrete time of T1 to T6, an interpolation value is computed by using the data values according to an interpolating equation, which will be discussed later. Hence, the original analog signal is reproduced sequentially. FIG. 6 is a diagram for explaining the interpolating equation.

As shown in FIG. 6, an interpolation value between two sample points having amplitude data values of D1 and D2 can be represented by a function in which two quadratic functions x1 and x2 regarding an interpolating position t are connected at an intermediate point. Namely, in the present embodiment, a part between two sample points is divided into a first half and a second half, and interpolation values thereof are respectively computed using the quadratic functions x1 and x2.

A timing data value T, which is a time interval between the sample points, may be an odd number or an even number. In the case of an odd number, an interpolating position t may not be set at an intermediate point. Therefore, in the present embodiment, an obtained timing data value is always set at an even number by performing double oversampling upon compression. Namely, the five timing data values "5,7,3,3,3" of FIG. 1 are transmitted or stored actually as values of "10,14,6,6,6" by double oversampling. In FIG. 6, a time interval between the sample points is represented by 2T obtained after oversampling.

In FIG. 6, the two quadratic functions x1 and x2 are respectively represented by the following equations.

$$x1 = D1 + at^2 \quad (1)$$

$$x2 = D2 - a\,(t-2T)^2 \quad (2)$$

Moreover, since the functions x1 and x2 are connected at the intermediate point T of the successive sample points, the following equation is established.

$$x1 = x2 \ (t=T) \quad (3)$$

Here, when equations (1) and (2) are substituted for equation (3), the following equation is established.

$$D1 + aT^2 = D2 - aT^2 \quad (4)$$

When equation (4) is solved for a, the following equation is established.

$$a = -(D1-D2)/2T^2 \quad (5)$$

Therefore, the following equations are established by substituting equation (5) for equations (1) and (2).

$$x1 = D1 - \{(D1-D2)/2T^2\} \, t^2 \quad (6)$$

$$x2 = D2 + \{(D1-D2)/2T^2\}(2T-t)^2 \quad (7)$$

Namely, the original analog signal can be reproduced by performing equations (6) and (7) while an interpolating position t serves as a variable, which is sequentially incremented according to a clock of a doubled sampling frequency. In the present embodiment, such an interpolating operation is performed sequentially every time a signal line composed of an amplitude data value and a timing data value is inputted at each of discrete time T1 to T6.

Namely, in the example of FIG. 2, when amplitude data values on the samples points at time T1 and T2 and a timing data value therebetween are inputted, an interpolating operation is performed between the sample points so as to immediately reproduce the original analog signal. Further, when an amplitude data value on a sample point at time T3 and a timing data value between the sample points T2 and T3 are inputted, an interpolating operation is performed therebetween so as to immediately reproduce the original analog signal. The same operation is sequentially performed at the following time.

As described above, according to the present embodiment, it is possible to directly compress and expand an analog signal to be compressed on a time base without time/frequency conversion. Hence, it is also possible to simplify the configuration without complicated operations. Further, when compressed data is transmitted from the compression side and is reproduced on the expansion side, inputted compressed data can be sequentially processed and reproduced by a simple interpolating operation on a time base, thereby achieving real-time operations.

Besides, the interpolating operation represented by the above equations (6) and (7) can also be realized by hardware such as a logic circuit and by DSP (Digital Signal Processor) or software (a program stored in ROM, RAM, and the like).

The following will discuss another example of the above data interpolation. Here is the description of a method of computing an interpolation value by double oversampling and convolution that use amplitude data values D1 and D2 on successive sample points and a timing data value T therebetween FIG. 7 is a diagram showing the results of performing oversampling and convolution (D1=7, D2=3, T=5) on time of T1 and T2 of FIG. 2.

Figure 7:
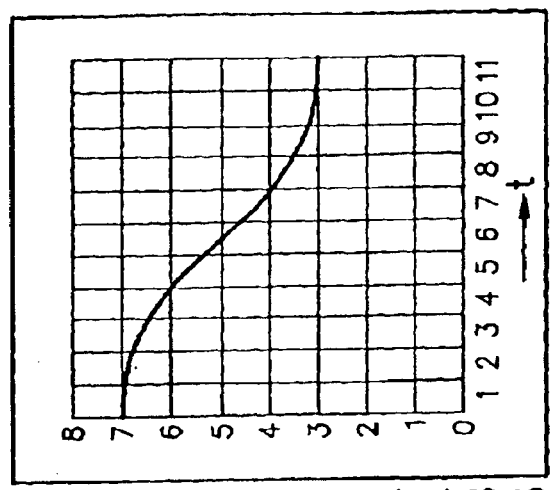
FIG. 7 is a diagram showing the results of performing oversampling and convolution on time T1 and T2 of FIG. 2.

In FIG. 7, a number "4" on the leftmost series r1 indicates a difference value (=D1−D2) of two amplitude data values D1 and D2. The ten "4" are arranged in a vertical direction to indicate that a difference value of the amplitude datavalues D1 and D2 is stored in D-type flip flops (not shown) making cascade connection while being sequentially delayed by one clock. The number of the D-type flip flops is twice a timing data value T=5.

Further, the second numeral series r2 from the left indicates the result of shifting the sample values of the first column r1 by one clock. Moreover, the third to fifth numeral series r3, r4, and r5 indicate the results of further shifting the sample values of the second numeral series r2 sequentially by one clock.

Besides, the sixth numeral series r6 indicates the result of adding the first to fifth numeral series r1 to r5 on each corresponding row, that is, the result of performing five-stage convolution on the first to fifth numeral series r1 to r5. Also, the seventh to tenth numeral series r7, r8, r9, and r10 indicate the results of further shifting the sample values of the sixth column r6 sequentially by one clock after convolution.

Also, the eleventh numeral series r11 indicates the result of adding the sixth to tenth numeral series r6 to r10 on each corresponding row, that is, the result of performing five-stage convolution on the sixth to tenth numeral series r6 to r10. Further, the twelfth numeral series r12 indicates the result of further shifting the sample values of the eleventh numeral series r11 by one clock after convolution.

Further, the thirteenth numeral series r13 indicates the result of adding the eleventh and twelfth numeral series r11 and r12 on each corresponding row. When the thirteenth numeral series r13 obtained by addition is represented by Mt, an interpolation value SOUT for interpolating two amplitude data values D1 and D2 is expressed by the following equation.

$$S_{OUT} = D1 - M1 \, (D1-D2)/(8T?T) = 7 - Mt/50$$

The interpolation value $S_{OUT}$ is plotted as shown in the graph of FIG. 7, and the same analog signal can be reproduced as time T1 and T2 of FIG. 1.

Figure 8:
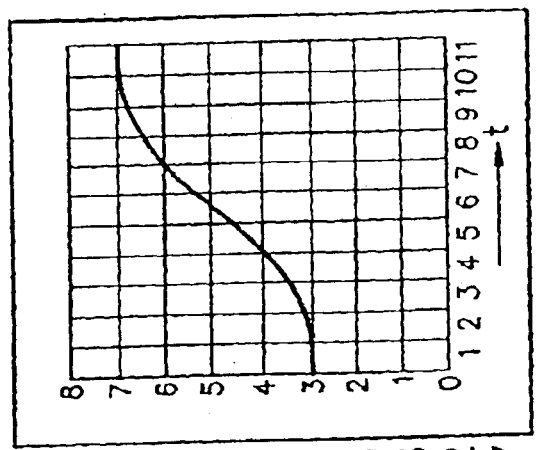
FIG. 8 is a diagram showing another results of performing oversampling and convolution.

Incidentally, when two amplitude data values D1 and D2 are reversed between a small value and a large value, for example, in the case of D1=3 and D2=7, double oversampling and convolution are performed as shown in FIG. 8.

The original analog signal of FIG. 1 can be reproduced by performing such data interpolation sequentially between all sample points. Additionally, the operations of FIGS. 7 and 8 can be performed by hardware having a plurality of D-type flip flops, adders, and multipliers that are combined as necessary for storing data values while making one-clock delay.

Figure 9:
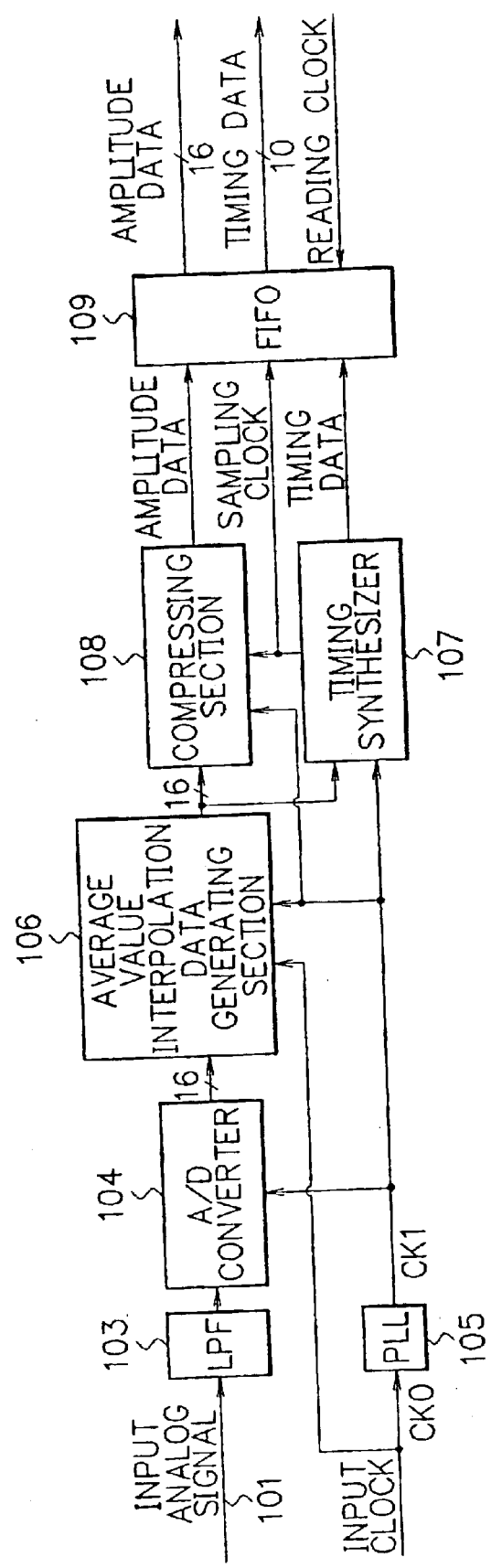
FIG. 9 is a block diagram showing an example of the configuration of a compression apparatus according to Embodiment 1.

Next, the following will discuss a configuration for realizing the above-mentioned compression and expansion. FIG. 9 is a block diagram showing an example of the configuration of a compression apparatus according to the present embodiment.

In FIG. 9, in order to readily detect a sample point, the input analog signal 101 is converted to digital data by an A/D converter 104 after noise is removed by an LPF 103. At this moment, the A/D converter 104 performs A/D conversion according to a clock CK1 having a double frequency (88.2 KHz). The clock CK1 is generated by a PLL (Phase Locked Loop) circuit 105 from an input clock CK0 having a predetermined frequency (e.g., 44.1 KHz in the case of an aural signal).

An average value interpolation data generating section 106 performs oversampling with a double frequency on digital data outputted from the A/D converter 104. And then, regarding a plurality of sample values obtained thus, average values are computed between successive sample values to generate interpolation data. Namely, when inputted digital data undergoes oversampling, a numeral series having the same two values successively is obtained. Regarding such a numeral series, when an average value is computed by using the same successive values, the values remain the same. When an average value is computed by using different successive values, an intermediate value is obtained between the different values.

Figure 10:
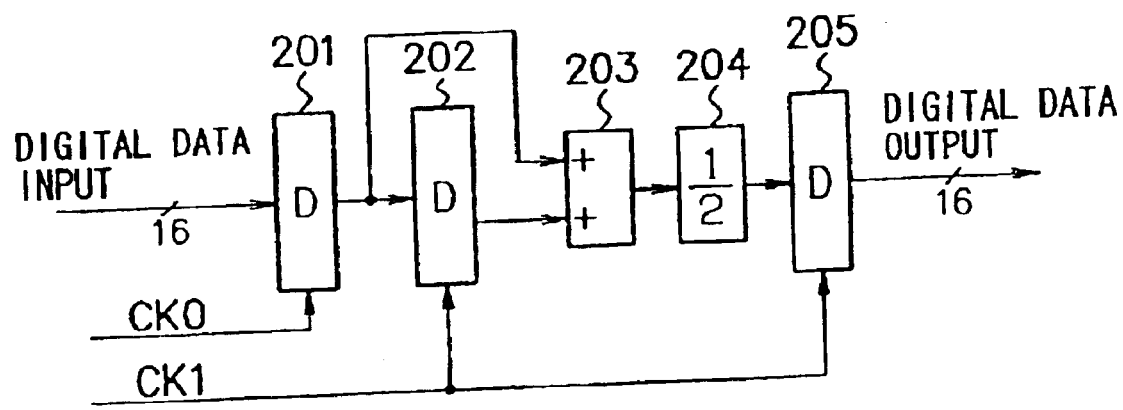
FIG. 10 is a block diagram showing an example of the configuration of an average value interpolation data generating section shown in FIG. 9.

FIG. 10 is a block diagram showing an example of the configuration of the average value interpolation data generating section 106. In FIG. 10, a D-type flip flop 201 stores digital data, which is outputted from the A/D converter 104 of FIG. 9, according to a reference input clock CK0. Further, a D-type flip flop 202 connected to the subsequent stage stores digital data, which is outputted from the D-type flip flop 201, according to a clock CK1 having a frequency twice that of the above input clock CK0.

And then, an adder 203 adds digital data stored in the two D-type flip flops 201 and 202, and outputs the results to a half multiplier 204. The half multiplier 204 divides the addition results of the adder 203 by a factor of 2, and a D-type flip flop 205 stores the results according to the clock CK1 having a double frequency. Subsequently, the digital data stored in the D-type flip flop 205 is outputted as interpolation data generated by double oversampling.

Since such an average value interpolation data generating section 106 is provided, it is possible to always set a timing data value at an even number. The timing data value is indicative of a time interval between sample points having differential absolute values at a predetermined value or smaller. Thus, it is not necessary to separately perform complicated operations for an even number and an odd number. Besides, in addition to oversampling, an average value of successive sample values is computed and outputted. Hence, a stepwise data waveform can be formed into a smooth waveform close to the original analog waveform. Therefore, it is possible to improve reproducibility of the original analog signal when expansion is performed by an decompression apparatus, which will be discussed later.

Digital data undergoing oversampling in the average value interpolation data generating section 106 is inputted to a timing synthesizer 107 and a compressing section 108. The timing synthesizer 107 differentiates digital data supplied from the average value interpolation data generating section 106 and detects sample points. And then, the timing synthesizer 107 computes and outputs a sampling clock indicative of timing of the detected point and timing data (the number of clocks CK1 having a double frequency) indicative of a time interval between the sample points.

Figure 11:
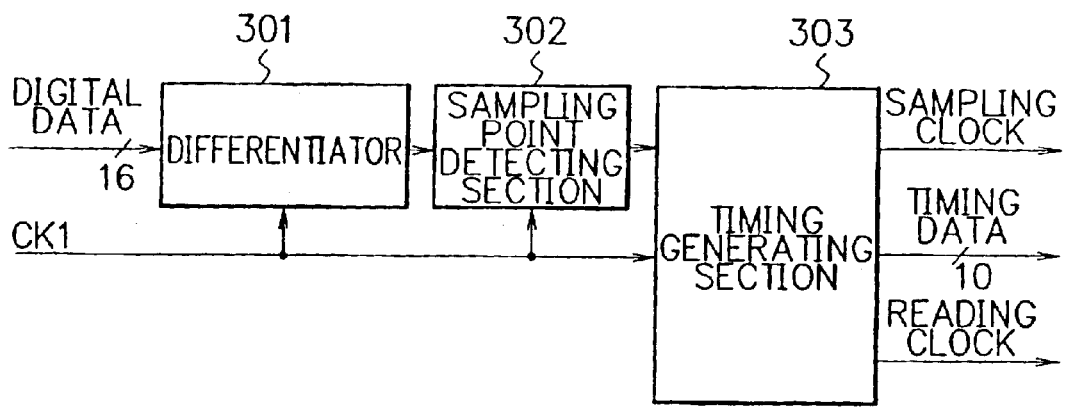
FIG. 11 is a block diagram showing an example of the configuration of a timing synthesizer shown in FIG. 9.

FIG. 11 is a block diagram showing an example of the configuration of the timing synthesizer 107. In FIG. 11, a differentiator 301 differentiates digital data inputted from the average value interpolation data generating section 106. Further, a sample point detecting section 302 detects sample points, on which digital data has differential absolute values at a predetermined value or smaller, based on the differentiation results of the differentiator 301.

A timing generating section 303 counts the number of clocks CK1 having a double frequency. The clocks CK1 are supplied from when a sample point is detected to when a subsequent sample point is detected. The timing generating section 303 outputs the number as timing data and outputs a sampling clock indicative of timing of a detected point of each sample point. Also, the timing generating section 303 also generates and outputs a reading clock, which will be discussed later.

Moreover, the compressing section 108 takes out only digital data on the corresponding sample point and outputs it as amplitude data according to a sampling clock outputted from the timing synthesizer 107. A FIFO memory 109 captures a pair of amplitude data on each sample point and timing data indicative of a time interval between sample points, according to a sampling clock. The amplitude data is outputted from the compressing section 108 and the timing data is outputted from the timing synthesizer 107. And then, the FIFO memory 109 reads the data in order according to a reading clock. A pair of amplitude data and timing data that is read therefrom is transmitted or recorded as compressed data.

Figure 12:
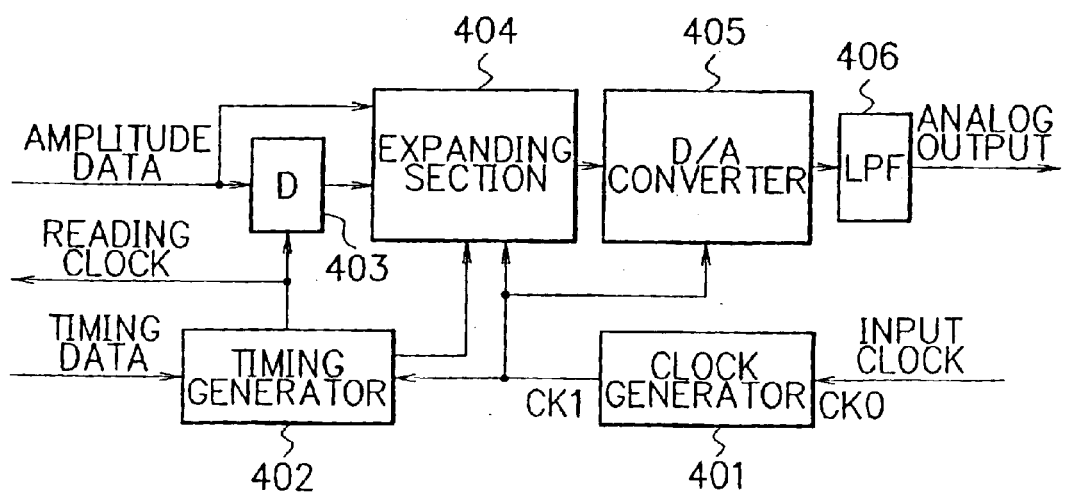
FIG. 12 is a block diagram showing an example of the configuration of an decompression apparatus according to Embodiment 1.

FIG. 12 is a block diagram showing an example of the configuration of the decompression apparatus of the present embodiment. In FIG. 12, a clock generator 401 generates a clock CK1 having a double frequency from a reference input clock CK0. Besides, a timing generator 402 generates a reading clock, which is indicative of time intervals as irregular as the sample points detected on the compression side, from the clock CK1 having a double frequency in response to timing data included in compressed data.

A D-type flip flop 403 captures and stores in order amplitude data, which is included in compressed data, at timing according to a reading clock generated by the timing generator 402, and the D-type flip flop 403 outputs the amplitude data to an expanding section 404. Amplitude data on an input/output stage of the D-type flip flop 403, that is, amplitude data stored in the D-type flip flop 403 at timing of a reading clock and amplitude data to be stored in the D-type flip flop 403 at timing of a subsequent reading clock (two pieces of amplitude data on two successive sample points) are inputted to the expanding section 404.

The expanding section 404 generates digital interpolation data between sample points by an interpolating operation of the above equations (6) and (7) or convolution shown in FIGS. 7 and 8, by using two pieces of amplitude data inputted thus and timing data inputted from the timing generator 402. And then, after digital interpolation data generated thus is converted to an analog signal by a D/A converter 405, the signal is outputted as a reproduced analog signal via an LPF 406.

As specifically described above, in the present embodiment, since an input analog signal varying smoothly is sampled on the compression side at irregular time intervals having differential absolute values at a predetermined value or smaller, it is possible to obtain discrete amplitude data values and timing data values indicative of irregular time intervals as compressed data. And then, on the expansion side, according to amplitude data values and timing data values that are included in compressed data, discrete data is read at time intervals as irregular as the compression side, and an analog signal is outputted, which connects pieces of the data by interpolation.

Therefore, when an analog signal on a time base is compressed and expanded, processing can be carried out on a time base without frequency conversion. For this reason, compression and expansion is not complicated and the configuration thereof can be simplified. Further, when compressed data is transmitted from the compression side and reproduced on the expansion side, compressed data to be inputted to the expansion side can be processed and reproduced in order by a simple interpolating operation on a time base, thereby achieving real-time operations.

Moreover, in the present embodiment, points where digital data has differential absolute values at a predetermined value or smaller are detected as sample points, compressed data is generated from amplitude data values on the detected sample points and timing data values indicative of time intervals of the sample points, and the compressed data is transmitted or recorded. Hence, only data on the sample points can be obtained as compressed data, achieving a high compressibility.

Furthermore, according to the present embodiment, inflection points, which exist in a signal to be compressed, are detected as sample points. Thus, compressed data includes all minimum points required for reproducing original data by an interpolating operation on the expansion side. Therefore, it is possible to obtain high-quality reproduced data with a higher reproducibility of original data.

Additionally, although Embodiment 1 describes that an input signal to be compressed is an analog signal, an input signal may be a digital signal. In this case, the LPF 103 and the A/D converter 104 of FIG. 9 are not necessary, and the D/A converter 405 and the LPF 406 of FIG. 12 are not necessary.

Besides, although the average value interpolation data generating section 106 performs double oversampling in Embodiment 1, the multiple is not limited to double as long as it is even.

(Embodiment 2)

Hereinafter, Embodiment 2 of the present invention will be discussed in accordance with the accompanied drawings. Embodiment 2 is devised to input and compress digital data. In a compression apparatus of the present embodiment, n-times oversampling and a moving average operation or a convoluting operation (hereinafter, referred to as convolution) are performed on inputted digital data to be compressed. Hence, it is possible to obtain smoother data in which pieces of discrete data are connected by interpolation.

Subsequently, from a series of data obtained thus, a position having a differential absolute value smaller than previous and subsequent positions, that is, a position having a minimum differential absolute value is detected as a sample point. And then, an amplitude data value on each detected sample point and a timing data value indicative of a time interval of the sample points are obtained, and a pair of the amplitude data value and the timing data value is transmitted or recorded as compressed data.

Figure 13:
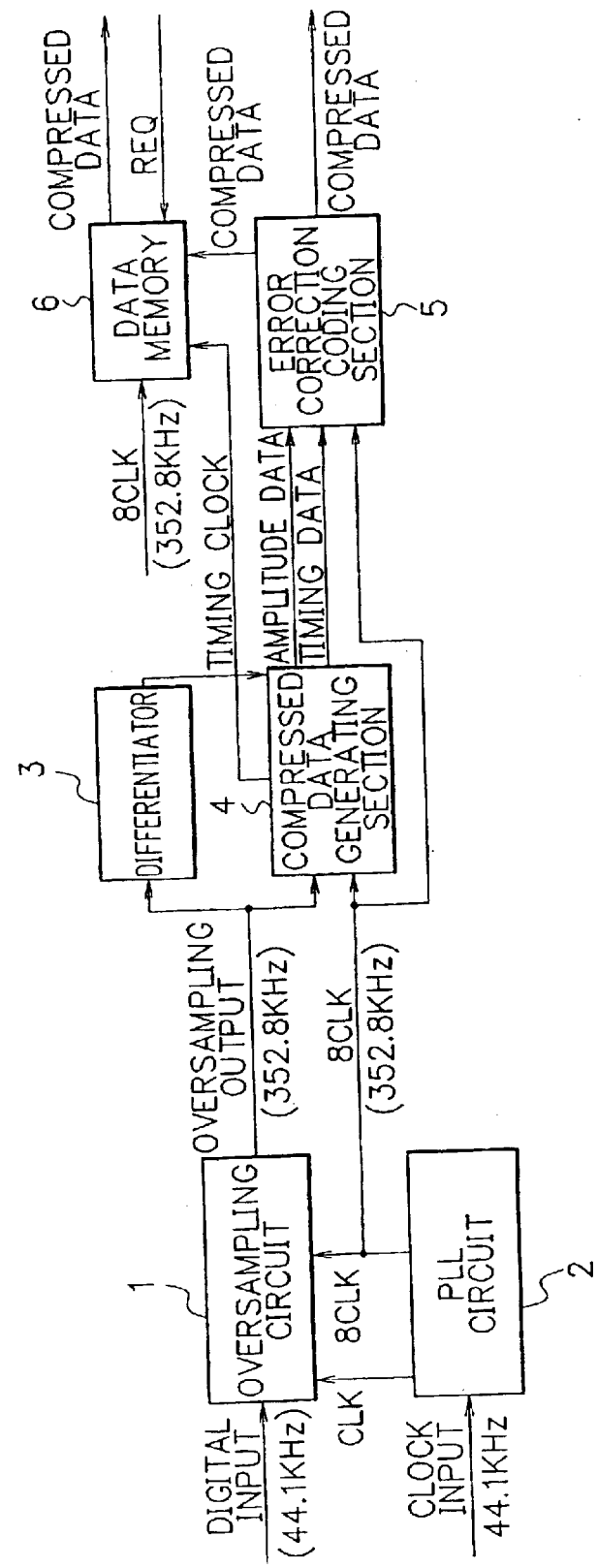
FIG. 13 is a block diagram showing an example of the configuration of a compression apparatus according to Embodiment 2.

FIG. 13 is a block diagram showing an example of the entire configuration of a compression apparatus for realizing the above compression method according to the present embodiment.

As shown in FIG. 13, the compression apparatus of the present embodiment is constituted by an oversampling circuit 1, a PLL (Phase Locked Loop) circuit 2, a differentiator 3, a compressed data generating section 4, an error correction coding section 5, and a data memory 6.

The oversampling circuit 1 performs n-times oversampling and convolution on inputted digital data to be compressed so as to compute a digital interpolation value for connecting pieces of discrete data. In the example of FIG. 13, as data to be compressed, the oversampling circuit 1 inputs voice data sampled at a frequency of 44.1 KHz, performs oversampling on the data at an eight-times frequency (352.8 KHz), and performs convolution. And then, the oversampling circuit 1 outputs a series of oversampled data obtained thus to the differentiator 3 and the compressed data generating section 4.

The PLL circuit 2 generates a clock 8CLK having an eight-times frequency (352.8 KHz) from an input clock CLK having a reference frequency (44.1 KHz) and supplies the clock 8CLK to the compressed data generating section 4, the error correction coding section 5, and the data memory 6 as well as the above oversampling circuit 1. The oversampling circuit 1, the compressed data generating section 4, the error correction coding section 5, and the data memory 6 operate in synchronization with the clock 8CLK having an eight-times frequency.

The differentiator 3 differentiates a series of oversampled data generated in the oversampling circuit 1 on each sampling point, and computes an absolute value thereof and outputs it to the compressed data generating section 4.

The compressed data generating section 4 detects as a sample point a position having a differential absolute value smaller than previous and subsequent positions, from a series of oversampled data supplied from the oversampling circuit 1. And then, a pair of an amplitude data value on each detected sample point and a timing data value indicative of a time interval of sample points is outputted to the error correction coding section 5. The compressed data generating section 4 also obtains a timing clock indicative of timing of a detected point on each sample point and outputs it to the data memory 6.

The error correction coding section 5 adds an error correcting code to data supplied from the compressed data generating section 4 in order to detect and accurately correct a varied bit even when digital data on a transmission line or a memory is changed by noise and the like and an error occurs. And then, the data obtained thus is outputted to a transmission line or the data memory 6 as compressed data.

The data memory 6 is a record medium for storing compressed data. The data memory 6 records compressed data, which is generated by the error correction coding section 5, according to a timing clock from the compressed data generating section 4. Further, the data memory 6 reads and outputs stored compressed data in response to a reading request signal REQ supplied from outside.

Figure 14:
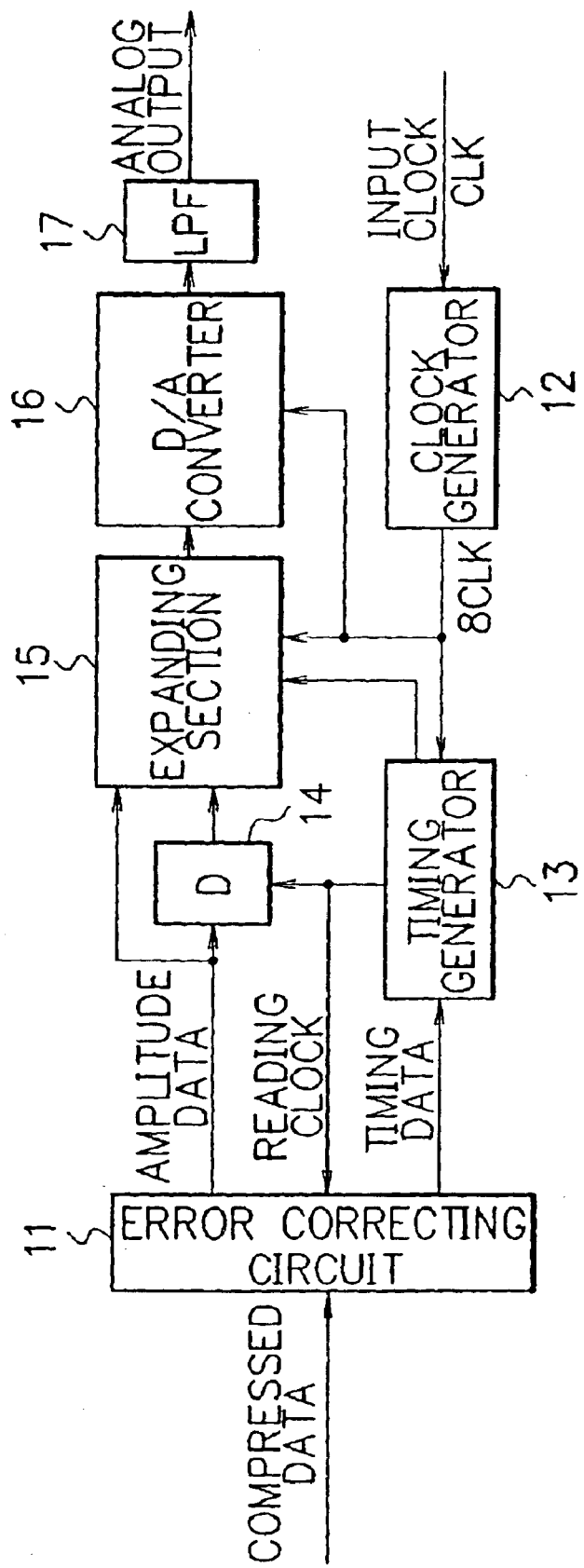
FIG. 14 is a block diagram showing an example of the configuration of an decompression apparatus according to Embodiment 2.

FIG. 14 is a block diagram showing an example of the entire configuration of an decompression apparatus for realizing an decompression method corresponding to the above compression method according to the present embodiment.

As shown in FIG. 14, the decompression apparatus of the present embodiment is constituted by an error correcting circuit 11, a clock generator 12, a timing generator 13, a D-type flip flop 14, an expanding section 15, a D/A converter 16, and a low-pass filter (LPF) 17.

The error correcting circuit 11 inputs compressed data generated in the compression apparatus of FIG. 13, detects a bit varied on a transmission line or memory, and corrects an error, by using an error correcting code added to the data.

The clock generator 12 generates a clock 8CLK having an eight-times frequency from an input clock CLK having a reference frequency and supplies the clock 8CLK to the timing generator 13, the expanding section 15, and the D/A converter 16. Also, the timing-generator 13 receives from the error correcting circuit 11 timing data included in compressed data, generates a reading clock, which is indicative of time intervals as irregular as sample points detected on the compression side, from the clock 8CLK having an eight-times frequency, and supplies the reading clock to the error correcting circuit 11 and the D-type flip flop 14.

The D-type flip flop 14 sequentially captures and stores amplitude data, which is included in compressed data, from the error correcting section 11 at timing corresponding to a reading clock generated by the timing generator 13, and the D-type flip flop 14 outputs the amplitude data to the expanding section 15. Amplitude data of an input/output stage of the D-type flip flop 14, that is, amplitude data stored in the D-type flip flop 14 at timing of a reading clock and amplitude data to be stored in the D-type flip flop 14 at timing of the subsequent reading clock (two pieces of amplitude data on two successive sample points) are inputted to the expanding section 15.

The expanding section 15 generates digital interpolation data between the sample points by an interpolating operation and so on, which will be discussed later, using two pieces of amplitude data inputted thus and timing data inputted by the timing generator 13. The D/A converter 16 converts digital interpolation data generated thus to an analog signal. Further, the LPF 17 performs a low-pass filter operation on an analog signal outputted from the D/A converter 16 so as to remove noise, and the analog signal is outputted as a reproduced analog signal.

Next, the following will discuss the details of the configuration and operations of the oversampling circuit 1 in the compression apparatus of FIG. 13.

Here, before describing the oversampling method of the present embodiment for computing an interpolation value between pieces of discrete digital data, a typical interpolating method conventionally used will be firstly discussed.

Data interpolation, which interpolates pieces of discrete digital data to obtain more continuous pieces of data, is carried out as shown in FIG. 5 by using, for example, a sampling function referred to as a sinc function of FIG. 4. The sinc function is defined as sin (?ft)/(?ft) when a sampling frequency is f. A value is set at 1 only on a sampling point of t=0, and values are all set at 0 on all of the other sampling points (t=1, ±2, ±3, ±4, . . . ) disposed at regular intervals.

Unlike a typical data interpolating method using such a sinc function, in the oversampling circuit 1 of the present embodiment, when an interpolation value is computed between two pieces of discrete data, each piece of digital data of a basic waveform undergoes oversampling. The waveform has amplitudes corresponding to n pieces of discrete data values that include the two pieces of discrete data. Further, the obtained n pieces of data are synthesized by convolution so as to digitally compute an interpolation value for connecting the two pieces of discrete data.

Figure 15:
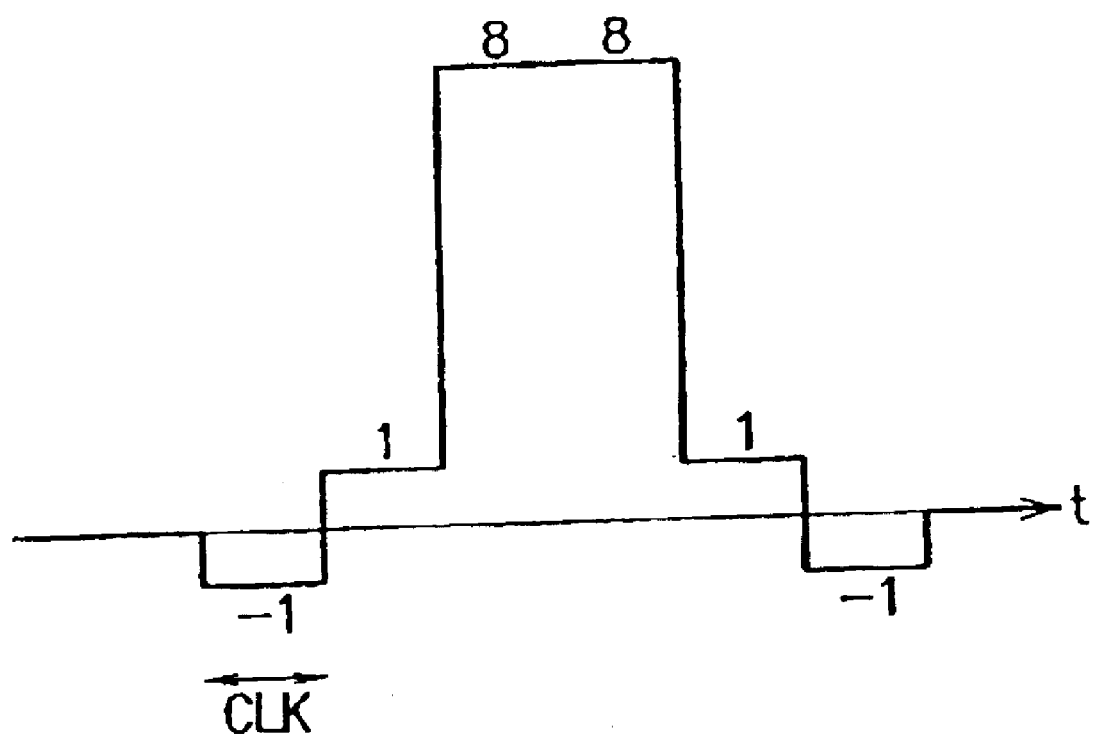
FIG. 15 is a diagram showing a digital basic waveform used in Embodiment 2.

FIG. 15 is an explanatory drawing showing a digital basic waveform used in the present embodiment. The digital basic waveform of FIG. 15 is a basic sampling function, which is used when data is interpolated by over sampling. The digital basic waveform is formed by changing a data value to −1, 1, 8, 8, 1, and −1 for each clock (CLK) having a reference frequency.

Figure 16:
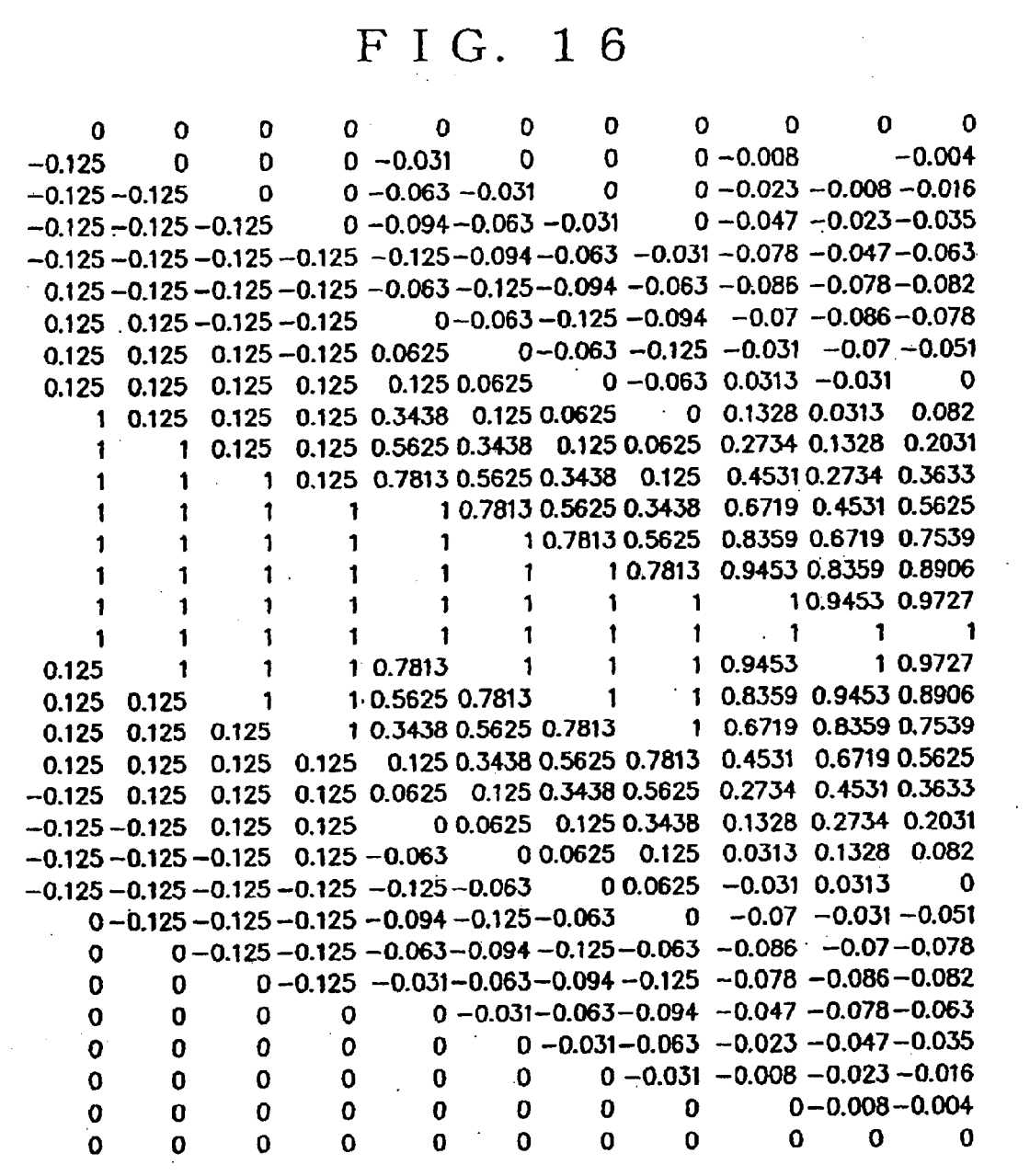

Referring to FIG. 16, the following will discuss a principle of data interpolation according to the present embodiment, by taking as an example the case where an interpolation value is generated by n-times oversampling and convolution from discrete data values (−1, 1, 8, 8, 1, −1)/8, which correspond to a normalized digital basic waveform shown in FIG. 15. Besides, in consideration of a space of the drawing, FIG. 16 shows an example of four-times oversampling. The oversampling circuit 1 of FIG. 13 actually performs eight-times oversampling.

In FIG. 16, a numeral series shown on the leftmost side indicates values obtained by performing four-times oversampling on original discrete data values of (−1, 1, 8, 8, 1, −1)/8. Further, in four numeral series from the leftmost side to the right, the values on the leftmost side are shifted downward one by one. A direction of the numeral series represents a time base in FIG. 16. Shifting a numeral series downward is equivalent to gradual delay of the numeral series indicated on the leftmost side.

Namely, the second numeral series from the left indicates a numeral series shifted from the leftmost numeral series by a quarter phase of a clock 4CLK having a quadruple frequency. Moreover, the third numeral series from the left indicates a numeral series shifted from the second numeral series from the left by a quarter phase of the clock 4CLK having a quadruple frequency. The fourth numeral series from the left indicates a numeral series shifted from the third numeral series from the left by a quarter phase of the clock 4CLK having a quadruple frequency.

Further, the fifth numeral series from the left has values obtained by adding values of the first to fourth numeral series on each of the corresponding rows and dividing the added values by four. The operations on the first to fifth numeral series from the left can digitally perform quadruple oversampling together with four-phase convolution.

Four numeral series from the fifth numeral series to the right (fifth to eighth numeral series from the left) indicate numeral series shifted downward one by one from the fifth numeral series. Also, the ninth numeral series from the left has values obtained by adding values of the fifth to eighth numeral series on each of the corresponding rows and dividing the added values by four. The operations on the first to ninth numeral series from the left can digitally perform quadruple oversampling twice together with four-phase convolution.

Further, the tenth numeral series from the left is a numeral series shifted downward by one from the ninth numeral series. Besides, the eleventh numeral series (on the rightmost side) from the left has values obtained by adding values of the ninth and tenth numeral series on each of the corresponding rows and dividing the added values by two. The values on the rightmost side are target interpolation values.

Figure 17:
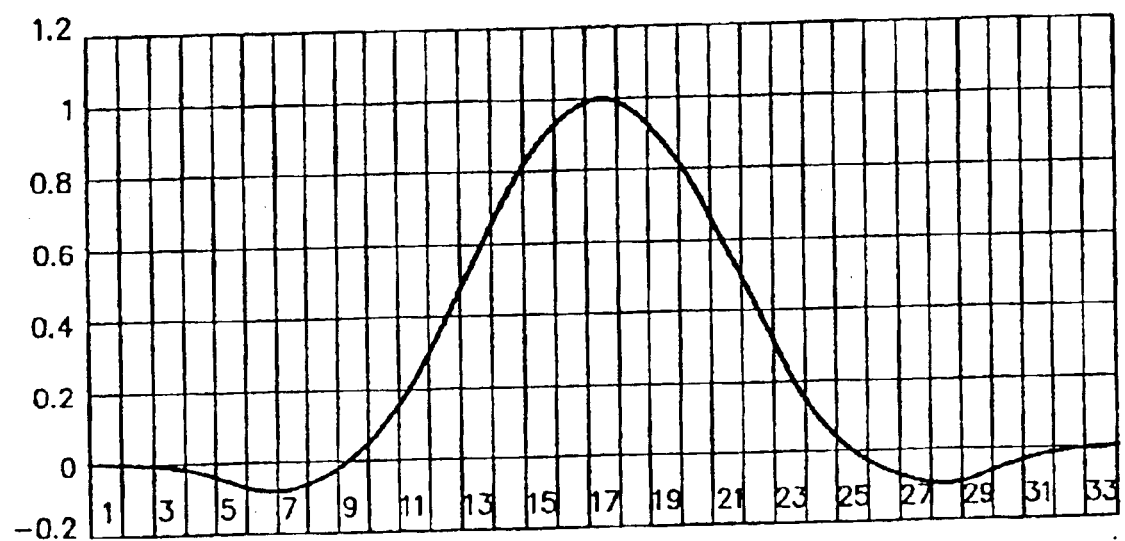
FIG. 17 is a diagram showing a function generated from the digital basic waveform of FIG. 15.

FIG. 17 is a graph showing the finally obtained numeral series on the rightmost side of FIG. 16. A function having a waveform of FIG. 17 can be differentiated for one time throughout a range. The function has a limited value other than 0 when a sampling position t along a lateral axis is 1 to 33, and the function has values all set at 0 in other regions.

When the function has a limited value other than 0 on a local region and has 0 in other regions, the state is referred to as a "definite base".

Also, the function of FIG. 17 is a sampling function characterized by having a maximum value only on a sample point of t=17 and a value of 0 on four sample points of t=1, 9, 25, 33. The function passes through all sample points required for obtaining data with a smooth waveform.

As described above, the function of FIG. 17 is a sampling function and differentiation is possible for one time throughout the region. Additionally, the function has a definite base, which converges to 0 at sampling positions of t=1, 33. Therefore, since superposition is made by using the sampling function of FIG. 17 based on each piece of discrete data, it is possible to interpolate a value between pieces of discrete data by using the function, which can be differentiated for one time.

The conventionally used sinc function converges to 0 on a sample point of t=±?. Thus, when an interpolation value is computed accurately, it is necessary to calculate a value of the sinc function on an interpolating position for each piece of discrete data until t=±? and to perform a convoluting operation using the value. In contrast, the sampling function of FIG. 17 used in the present embodiment converges to 0 on sample points of t=1, 33. Hence, only discrete data within a range of t=1 to 33 needs to be considered.

Therefore, when a certain interpolation value is obtained, only values of limited n pieces of discrete data need to be considered, thereby largely reducing an amount of processing. Additionally, discrete data beyond the range of t=1 to 33 is ignored. This is not because a processing quantity, accuracy, and so on need to be considered but because the discrete data does not need to be considered theoretically. Thus, a censoring error does not occur. Therefore, it is possible to accurately obtain an interpolation value by using the data interpolation of the present embodiment and to improve the reproducibility of original data before compression regarding data reproduced on the expansion side when compression is performed using the accurate interpolation value.

FIG. 18 is a block diagram showing an example of the configuration of the oversampling circuit 1 shown in FIG. 13. As shown in FIG. 18, the oversampling circuit 1 of the present embodiment is constituted by a normalized data memory 21, a phase shifting section 22, a plurality of digital multipliers 23a to 23d, and a plurality of digital adders 24a to 24c. Besides, a PLL circuit 2 of FIG. 18 is identical to that of FIG. 13.

The normalized data memory 21 shifts a series of normalized data in four phases and stores the data as shown on the rightmost side of FIG. 16. Additionally, FIG. 16 shows an example in which quadruple oversampling is performed on the digital basic waveform of FIG. 15. Since the oversampling circuit 1 of FIG. 13 performs eight-times oversampling, in the normalized data memory 21, a digital basic waveform undergoes eight-times oversampling and a series of data normalized by convolution is stored therein. Four-phase normalized data stored in the normalized data memory 21 is read in response, to clocks CLK and 8CLK supplied from the PLL circuit 2, and the data is supplied to one of the input terminals of each of the four digital multipliers 23a to 23d.

Moreover, the phase shifting section 22 performs a phase shifting operation for shifting the phase of discrete data, which is inputted as data to be compressed, to four phases. Four-phase discrete data generated by the phase shifting section 22 is outputted in response to the clocks CLK and 8CLK supplied from the PLL circuit 2, and the data is supplied to the other input terminal of each of the four digital multipliers 23a to 23d.

The four digital multipliers 23a to 23d multiply four-phase normalized data, which is outputted from the normalized data memory 21, and four-phase discrete data, which is outputted from the phase shifting section 22. The three digital adders 24a to 24c, which are connected to the subsequent stage of the multipliers, add all the multiplication results of the four digital multipliers 23a to 23d and output the results of the addition to the differentiator 3 and the compressed data generating section 4 of FIG. 13.

In the configuration of the oversampling circuit 1 shown in FIG. 18, the normalized data memory 21 constitutes storing means of the present invention. Further, the phase shifting section 22, the digital multipliers 23a to 23d, and the digital adders 24a to 24c constitute synthesizing means of the present invention.

As shown in the configuration of FIG. 18, in the present embodiment, the normalized data memory 21 such as ROM stores in advance normalized data, which is obtained by convolution on the rightmost side of FIG. 16. And then, the normalized data is modulated to amplitude corresponding to a value of discrete data inputted as data to be compressed. The obtained data is synthesized by four-phase convolution and is outputted.

An amplitude value of discrete data, which is inputted as data to be compressed, may be multiplied relative to the digital basic waveform of FIG. 15, and convolution of FIG. 16 may be performed on an obtained data value during compression. In the case of the oversampling circuit 1 configured as FIG. 18, it is not necessary to perform convolution of FIG. 16 during actual compression, thereby increasing a compression speed.

Figure 19:
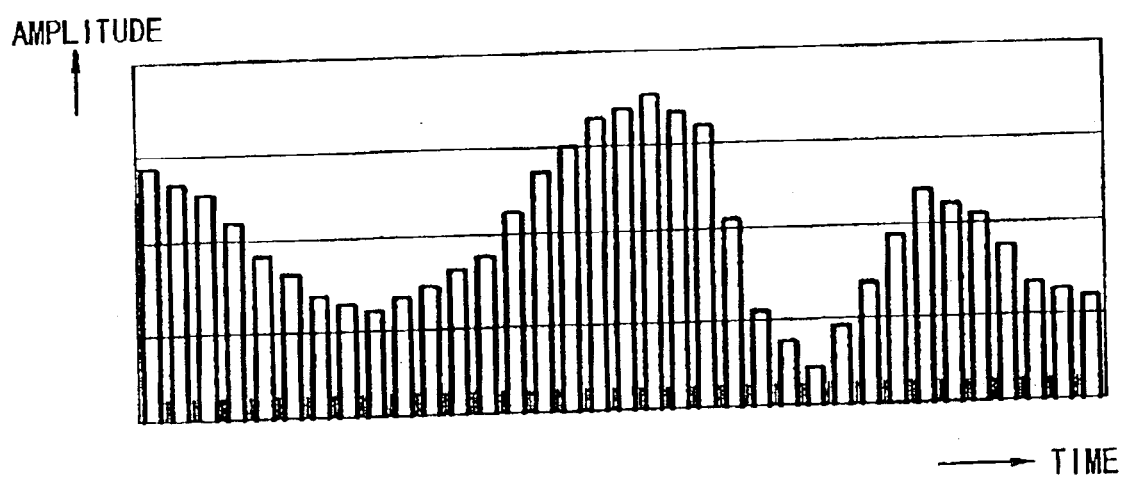
FIG. 19 is a diagram showing an example of digital data inputted to the compression apparatus of Embodiment 2.
Figure 20:
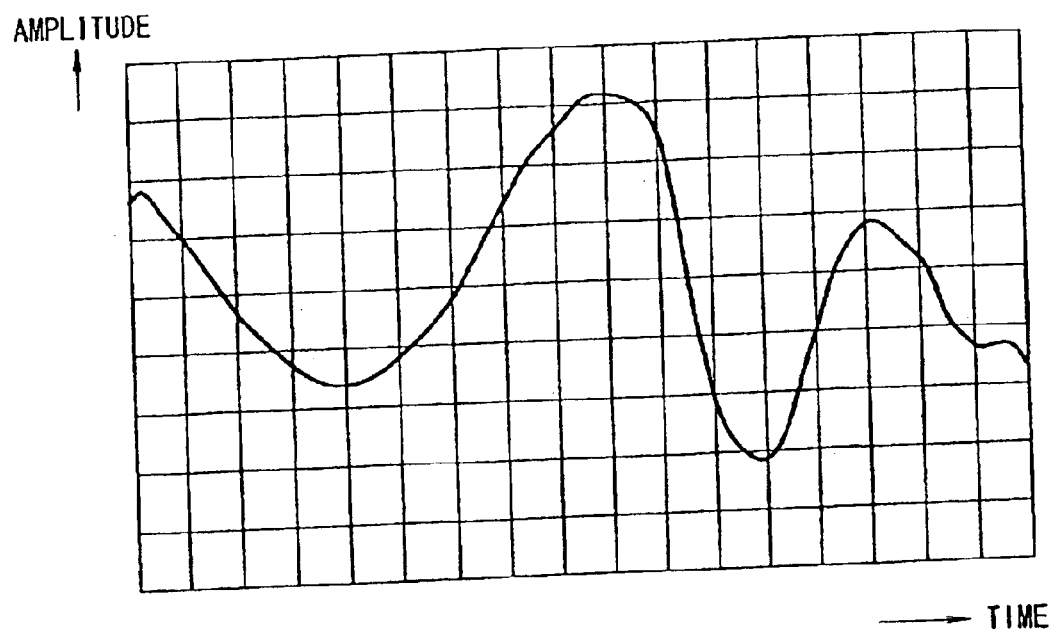
FIG. 20 is a diagram showing an example of data outputted by passing digital data of FIG. 19 through an oversampling circuit of FIG. 13.

FIG. 19 is a diagram showing an example of digital data inputted to the oversampling circuit 1. FIG. 20 is a diagram showing output data after the oversampling circuit 1 performs data interpolation on the digital data. As shown in the above diagram, with the oversampling circuit 1 of the present embodiment, it is possible to obtain continuous oversampled data, in which values change more smoothly, from original discrete digital data.

Next, as for digital data undergoing such oversampling, the following will discuss in detail the operation of generating compressed data by using the differentiator 3 and the compressed data generating section 4 of FIG. 13, and the operation of decompression compressed data by using the timing generator 13, the D-type flip flop 14, and the expanding section 15 of FIG. 14.

First, the compression operation will be discussed. As described above, the differentiator 3 of FIG. 13 differentiates a series of oversampled data, which is generated in the oversampling circuit 1, on each sampling point, and obtains an absolute value of the data and outputs it to the compressed data generating section 4.

Figure 21:
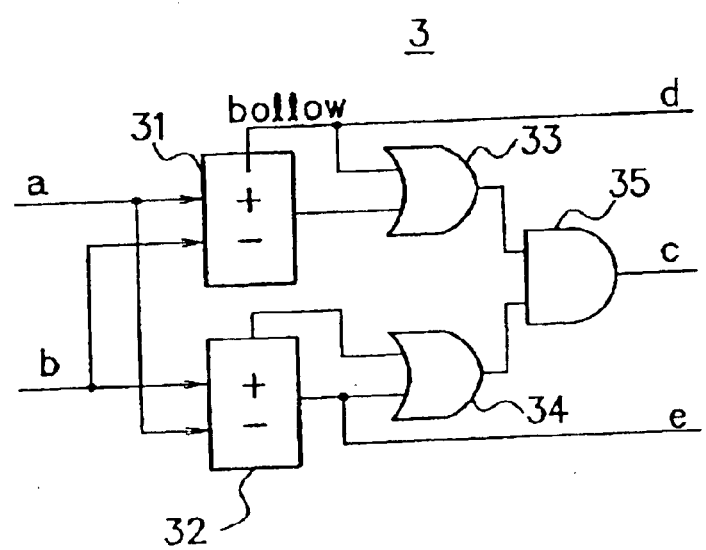
FIG. 21 is a diagram showing an example of the configuration of a differentiator shown in FIG. 13.
Figure 2:
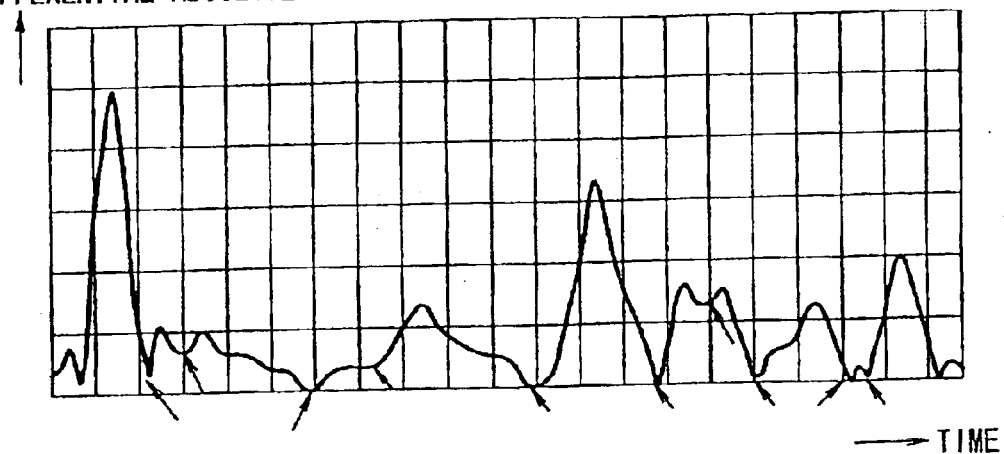
Figure 2:
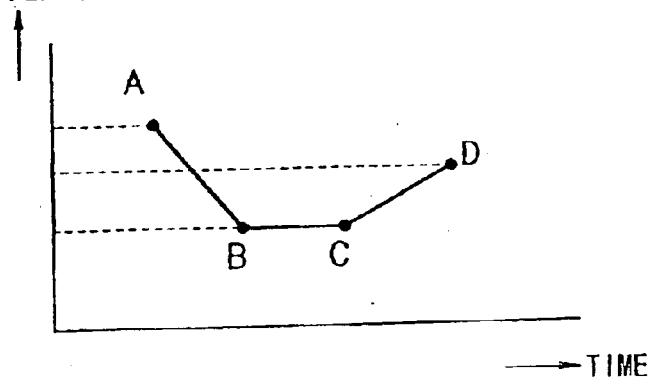

FIG. 21 is a diagram showing an example of the configuration of the differentiator 3. As shown in FIG. 21, the differentiator 3 of the present embodiment is composed of a difference absolute value circuit for computing a difference absolute value between pieces of data on two successive sampling points.

In FIG. 21, subtracters 31 and 32 respectively compute differences between pieces of data on two successive sampling points, the data being inputted from nodes a and b. Namely, the subtracter 31 computes a difference a–b, and the subtracter 32 computes a difference b–a. The results are respectively outputted to OR circuits 33 and 34. The subtracters 31 and 32 output a value of "1" as a bollow in addition to difference values when computed difference values are negative.

The OR circuit 33 ORs a difference value and bollow output that are computed in the subtracter 31, and outputs the results to an AND circuit 35. Moreover, the other OR circuit 34 ORs a difference value and bollow output that are computed in the subtracter 32, and outputs the results to the AND circuit 35. The AND circuit 35 ANDs the outputs from the two OR circuits 33 and 34 and outputs the results to a node c. Also, the bollow output of the subtracter 31 is outputted to a node d, and a difference value computed in the subtracter 32 is outputted to a node e.

Therefore, a difference absolute value $|a-b|$ of data on two successive sampling points is outputted to the node c, a value of "1" is outputted to the node d when a data value of the node b is larger than that of the node a, and a difference value b–a between pieces of data of the nodes a and b is outputted to the node e.

Besides, for explanation, FIG. 21 shows only one-bit data lines of the nodes a, b, c, and e. Actually, data lines are equivalent to the number of bits.

The compressed data generating section 4 of FIG. 13 detects as a sample point a point where a differential absolute value is smaller than those of previous and subsequent positions, from a series of oversampled data supplied from the oversampling circuit 1. And then, a pair of an amplitude data value on each detected sample point and a timing data value indicative of a time interval of sample points is outputted to the error correction coding section 5.

In the present embodiment, when a sample point is detected based on a differential absolute value computed in the differentiator 3, in order to provide a margin for determining a sample point, determination is made after dropping a lower-order bit of a difference absolute value computed by the differentiator 3. For example, when one bit of a lower order is dropped, determination can be made on the assumption that a difference absolute value is always 0 when an actually computed difference absolute value ranges from 0 to 1. Also, when two bits of a lower order are dropped, determination can be made on the assumption that a difference absolute value is always 0 when an actually computed difference absolute value ranges from 0 to 3. With this operation, it is possible to avoid influence of slight change such as noise, and unnecessary points are not detected as sample points, thereby increasing compressibility.

FIG. 22 is a diagram showing the results of computing a differential absolute value by the differentiator 3 regarding data outputted from the oversampling circuit 1 of FIG. 20. As described above, the compressed data generating section 4 detects a point where a differential absolute value is smaller than those of previous and subsequent points, that is, a point where a minimum differential absolute value appears (position indicated by arrows of FIG. 22) as a sample point, based on output data of a differential absolute value shown in FIG. 22. Besides, minimum values appearing on the first and last point may be incorrect data values. Thus, such a point is not adopted as a sample point.

When a lower-order bit of a differential absolute value is dropped to provide a margin for detecting a sample point, two equal minimum values may appear successively. In this case, the polarity of a differential value is determined based on a bollow value of the subtracter 31, the bollow value being outputted to the node d of the differentiator 3 shown in FIG. 21, and a point where a differential value changes in polarity is detected as a sample point.

Furthermore, when a differential value does not change in polarity, as shown in FIG. 23, in view of the relationship between differential absolute values on sampling points A and D disposed before and after two successive sampling points B and C having equal values, a point closer to a smaller value is detected as a sample point. In the example of FIG. 23, since the sampling point D is smaller than the sampling point A in differential absolute value, the sampling point C closer to the sampling point D is detected as a sample point.

As an operation for detecting a sample point, double differentiation is performed as follows: after data supplied from the oversampling circuit 1 is differentiated once, an obtained differential absolute value is further differentiated. A point just before a double differential value changes in polarity from negative or 0 to positive may be extracted as a sample point. Further, from points extracted thus based on the polarity of double differential values, only a point where a first differential absolute value is smaller than a fixed value may be detected as a normal sample point.

In other words, on a minimum point of a differential absolute value obtained by first differentiation, a double differential value, which is obtained by further differentiating a first differential absolute value, surely changes in polarity from negative to positive. Thus, when a double differential value of oversampled data is computed and a point where polarity changes from negative to positive (including a point having a double differential value of 0) is detected, a minimum point of a first differential absolute value can be detected accurately. Furthermore, even when two successive minimum points appear with equal values, one of them can be positively detected as a sample point. Moreover, by detecting as a normal sample point only a point where a first differential absolute value is below a fixed value, it is possible to prevent an unnecessary point from being detected as a sample point, thereby increasing compressibility.

Figure 24:
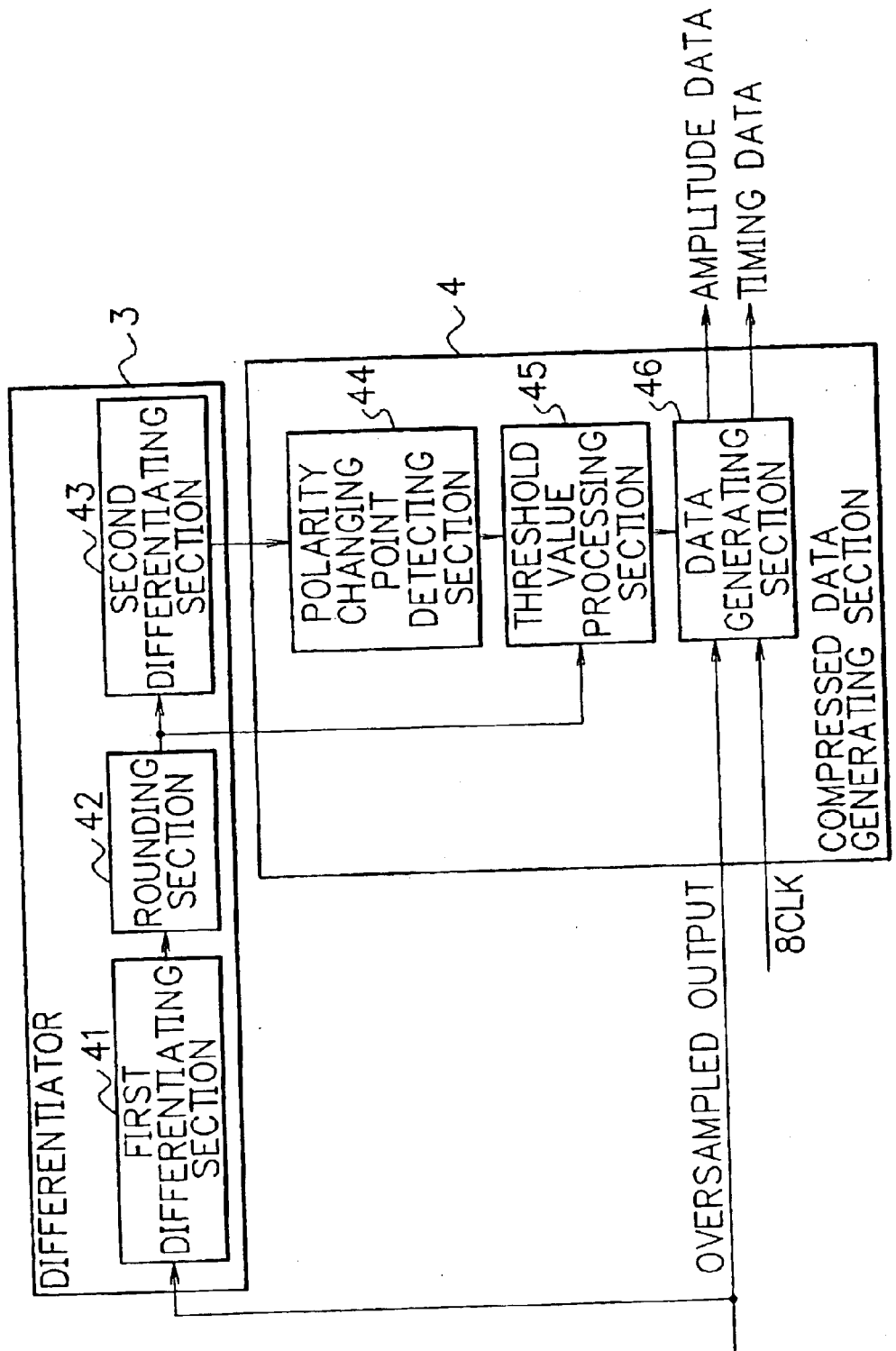
FIG. 24 is a block diagram showing an example of the configuration for detecting a sample point by double differentiation.

FIG. 24 is a block diagram showing an example of the configuration for detecting a sample point by performing the above double differentiation. FIG. 24 shows examples of the configurations of the differentiator 3 and the compressed data generating section 4 that are shown in FIG. 13.

As shown in FIG. 24, the differentiator 3 is provided with a first differentiating section 41, a rounding section 42, and a second differentiating section 43. Additionally, the compressed data generating section 4 is provided with a polarity changing point detecting section 44, a threshold value processing section 45, and a data generating section 46.

The first differentiating section 41 differentiates oversampled data supplied from the oversampling circuit 1 of FIG. 13 for each sampling point and computes and outputs an absolute value of the data. The rounding section 42 drops a lower-order bit of a first differential absolute value computed by the first differentiating section 41. For example, three bits of a lower order are dropped by dividing the above first differential absolute value by eight, thereby removing the influence of slight change caused by noise. Data outputted from the rounding section 42 is supplied to the second differentiating section 43 and the threshold value processing section 45 in the compressed data generating section 4.

The second differentiating section 43 further differentiates a first differential absolute value, which is rounded by the rounding section 42, for each sampling point. A double differential value computed by the second differentiating section 43 and a bollow value indicative of its polarity are supplied to the polarity changing point detecting section 44 in the compressed data generating section 4.

As a candidate of a sample point, the polarity changing point detecting section 44 extracts a point just before a double differential value supplied from the second differentiating section 43 in the differentiator 3 changes in polarity from negative to positive, for example, the last negative point when double differential values with negative polarity are successively obtained, or a point where a double differential value is 0. When double differential values are not successively obtained with negative polarity, the corresponding negative point may be further extracted as a candidate of a sample point.

The threshold value processing section 45 compares a first differential absolute value supplied from the rounding section 42 and a predetermined threshold value, regarding candidates of sample points that are extracted from the polarity changing point detecting section 44. The threshold value processing section 45 detects as a normal sample point only a point where a first differential absolute value is smaller than a threshold value and transmits the point to the data generating section 46.

The data generating section 46 obtains an amplitude data value on each sample point detected thus, from oversampled data supplied from the oversampling circuit 1. The data generating section 46 generates a timing data value indicative of a time interval of sample points by using a clock 8CLK, which is supplied from the PLL circuit 2 with an eight-times frequency. And then, a pair of the amplitude data value and the timing data value is outputted as compressed data.

Additionally, in the example of FIG. 24, a threshold value is processed using a first differential absolute value rounded by the rounding section 42. A threshold value may be processed using a first differential absolute value computed by the first differentiating section 41 before rounding. Further, in FIG. 24, a point just before a double differential value changes in polarity from negative to positive is extracted as a sample point. A point just after polarity changes from negative to positive may be extracted as a sample point. Moreover, the processing of a threshold value of FIG. 24 is not limited to double differentiation for detecting a sample point. The processing is applicable when a sample point is detected by one-time differentiation.

FIG. 25 is a diagram showing compressed data (pair of an amplitude data value and a timing data value on each sample point) outputted according to the example of FIG. 22. For example, determination data (two bits), which determines a signal type, and an error correcting code are added to compressed data outputted thus. Thereafter, compression such as variable-length coding may be further carried out.

The principles of compression and expansion of Embodiment 2 are also shown in FIGS. 1 and 2. However, in the case of the present embodiment, the waveform data of FIG. 1 corresponds to oversampled data, which is generated continuously by data interpolation of the oversampling circuit 1. Moreover, the waveform data of FIG. 2 corresponds to data obtained by the process for reproducing original oversampled data by expansion.

Referring to FIG. 1, compression will be firstly discussed. In the present embodiment, from inputted oversampled data 101, sample points 102a to 102f having minimum differential absolute values are detected. And then, amplitude digital data values on the sample points 102a to 102f and timing data values indicative of time intervals of the sample points 102a to 102f are obtained. A pair of an amplitude data value and a timing data value is outputted to the error correction coding section 5 of FIG. 13 as compressed data.

Referring to FIG. 2, the following will discuss an decompression operation of data compressed as shown in FIG. 1. When input data 101 is compressed according to the compression method of FIG. 1, obtained compressed data is a numeral series of (*, 7), (5,3), (7,9), (3,1), (3,6), and (3,3). Here, * indicates that no value is shown in FIG. 1. Further, compressed data is inputted in the above order to the timing generator 13 and the D-type flip flop 14 on the expansion side.

First, in the expanding section 15 of FIG. 14, data of a waveform a1 is generated by an interpolating operation from two data values of an amplitude data value "7" and a timing data value "5", which are firstly outputted from the error correction coding section 11. Next, data of a waveform a2 is generated by an interpolating operation from two data values of the above timing data value "5" and an amplitude data value "3", which is subsequently inputted.

Subsequently, data of a waveform b2 is generated by an interpolating operation from two data values of the above amplitude data value "3" and a timing data value "7", which is subsequently inputted. Further, data of a waveform b1 is generated by an interpolating operation from the above timing data value "7" and an amplitude data value "9", which is subsequently inputted. In this manner, data of waveforms c1, c2, d2, d1, e1, and e2 is generated in order by using combinations of successively inputted amplitude data values and timing data values.

The above operation generates digital data (upper stage of FIG. 2) having continuous waveforms a1, b1, c1, d1, and e1, and digital data (lower stage of FIG. 2) having continuous waveforms a2, b2, c2, d2, and e2. And then, the expanding section 15 adds the two pieces of digital data generated thus, outputs the data to the D/A converter 16, and performs digital-analog conversion thereon. Thus, an analog signal is reproduced, which corresponds to the oversampled data 101 of FIG. 1.

As data interpolation performed by synthesizing digital data on the upper stage and digital data on the lower stage of FIG. 2, for example, the operation described in FIG. 6 is applicable.

Besides, in Embodiment 2, since eight-times oversampling is carried out during compression, a timing data value indicative of a time interval between sample points is not an odd number but is always an even number (corresponding to 2T on a lateral axis of FIG. 6). Namely, the five timing data values "5, 7, 3, 3, 3" shown in FIG. 1 are actually transmitted or stored as values of "40, 56, 24, 24, 24" by eight-times oversampling.

When a timing data value T is an odd number, an interpolating position t is not placed just on an intermediate point between sample points. Thus, the operations need to be performed separately for an even number and an odd number of timing data values. However, in the case of the present embodiment, a timing data value indicative of a time interval between sample points is always an even number. Hence, it is not necessary to perform complicated operations such as separate operations for an even number and an odd number.

Next, another example of the above data interpolation will be discussed below. Here, the following will describe a method of determining an interpolation value by double oversampling and convolution using amplitude data values D1 and D2 on successive sample points and a timing data value T there between.

Figure 26:
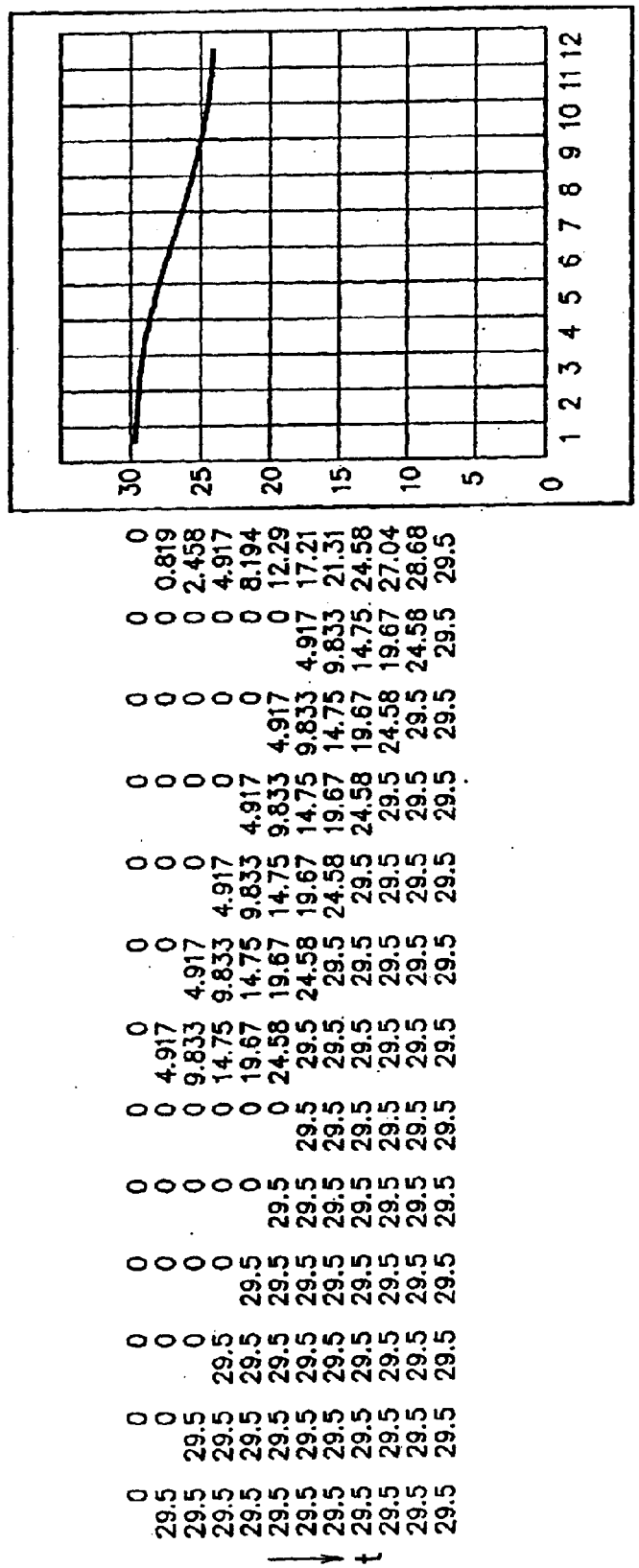
FIGS. 26A and 26B are diagrams for explaining another example of data interpolation on the expansion side.

FIGS. 26A and 26B are diagrams showing the results of oversampling and convolution performed on the first two sample points of compressed data shown in FIG. 25 (D1=29.5, D2=24.4, and T=6).

In FIG. 26A, numeric values "29.5" on the leftmost side are values of the first amplitude data D1. Twelve numeric values of "29.5" and "0" arranged vertically show that the amplitude data value D1 is stored in D-type flip flops and the like (not shown) making cascade connection while the amplitude data value D1 is delayed in order by one clock. The number of the D-type flip flops is twice as large as T=6, which is a timing data value. Further, the second to sixth numeral series from the left show the results of shifting the first numeral series in order by one clock.

Moreover, the seventh numeral series shows the result of adding and dividing by six the first to sixth numeral series on each corresponding row, that is, the result of performing six-phase convolution on the first to sixth numeral series. Additionally, the eighth to twelfth numeral series show the results of further shifting the values, which are subjected to convolution on the seventh numeral series, in order by one clock.

Also, the thirteenth numeral series shows the results of adding and dividing by six the seventh to twelfth numeral series on each corresponding row, that is, the results of performing six-phase convolution on the seventh to twelfth numeral series. The thirteenth numeral series on the rightmost side forms a desired interpolation curve (the sampling function a1 in the example of FIG. 2).

In the same manner as FIG. 26A, a sampling function a2 in the same section as the sampling function a1 is computed by using the same timing data value T (=6) and another amplitude data value D2 (=24.4). And then, by determining the sum of the computing results, as shown in FIG. 26B, it is possible to obtain an interpolation curve finally determined in the section. Original oversampled data is reproduced by performing such data interpolation sequentially on all of the sample points. Here, the operation of FIG. 26A can be realized by a hardware structure, which combines as necessary a plurality of D-type flip flops, adders, and multipliers. The D-type flip flops store data values while delaying the data values by one clock.

Additionally, as another example of data interpolation, the method shown in FIG. 7 is also applicable.

Figure 27:
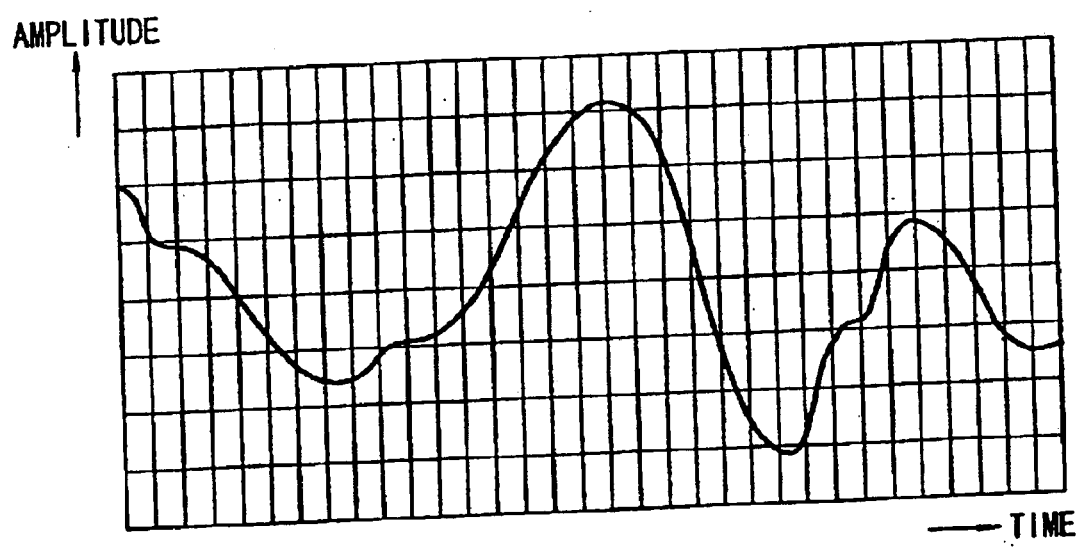
FIG. 27 is a diagram showing an example of expansion data outputted from an expanding section of FIG. 14 when expansion is performed on the compressed data of FIG. 25.

FIG. 27 is a diagram showing oversampled data, which is reproduced from the compressed data of FIG. 25.

As shown in comparison between the oversampled data of FIG. 27 that is obtained by expansion and the original oversampled data of FIG. 20 that is obtained before compression, the expansion of the present embodiment can reproduce data substantially equal to the original oversampled data.

In the decompression apparatus of FIG. 14, oversampled data reproduced thus is inputted to the D/A converter 16 and undergoes digital-analog conversion. Digital data before D/A conversion has already been a continuous and smooth signal as shown in FIG. 27. Therefore, unlike a conventional D/A converter, it is not necessary to artificially increase a sampling frequency by using a digital filter. The quality of an outputted analog signal can be remarkably improved simply by D/A conversion.

As specifically described above, in Embodiment 2, on the compression side, oversampling and convolution are performed on inputted discrete digital data to generate continuous data making smooth change, and obtained oversampled data is sampled at irregular time intervals having minimum differential absolute values. Thus, a discrete amplitude data value and a timing data value indicative of irregular time intervals are obtained as compressed data. And then, on the expansion side, according to an amplitude data value and a timing data value that are included in compressed data, discrete data is read at a time interval as irregular as the compression side, and continuous pieces of data are outputted. The pieces of data are connected by interpolation.

Therefore, when an analog signal on a time base is compressed and expanded, the operations can be performed on a time base without frequency conversion. For this reason, the compression and decompression operations are not complicated and the configuration for the operations can be simplified. Moreover, when compressed data is transmitted from the compression side and is reproduced on the expansion side, a simple interpolating operation on a time base can sequentially process and reproduce compressed data that is inputted on the expansion side. Hence, real-time operations can be realized.

Further, in the present embodiment, a point where digital data has a minimum differential absolute value is detected as a sample point, compressed data is generated from an amplitude data value on each detected sample point and a timing data value indicative of a time interval of sample points, and the compressed data is transmitted or recorded. Thus, only data on sample points is obtained as compressed data, thereby achieving high compressibility.

Furthermore, according to the present embodiment, an inflection point existing in a signal to be compressed is detected as a sample point, and compressed data includes all minimum points required for reproducing original data by an interpolating operation on the expansion side. Therefore, it is possible to improve reproducibility of original data, thereby obtaining high-quality reproduced data.

Additionally, in the present embodiment, when oversampling and convolution are performed on digital data, a function generated from a digital basic waveform is a sampling function with a definite base that has a value converging to 0 on a limited sampling position, and the function can be differentiated for one time. Thus, when a certain interpolation value is obtained, only values of a limited number of pieces of discrete data need to be considered, thereby largely reducing an amount of processing. Besides, since a censoring error does not occur, an interpolation value can be obtained accurately, and as for data reproduced on the expansion side when compression is made using the interpolation value, it is possible to improve reproducibility of original data before compression.

Besides, the convolution discussed in Embodiment 2 is just an example and the present invention is not limited to the above convolution.

Moreover, in Embodiment 2, although a digital basic waveform has −1, 1, 8, 8, 1, −1, a digital basic waveform is not limited to the above example. Namely, any waveform is applicable as long as an obtained interpolating function is differentiated for one time throughout a range and has a definite function converging to 0 on a limited sampling position. For example, the weight on both sides may be 1 or 0 instead of −1. Also, the weight at the center may be set at a value other than eight. In either case, satisfactory curve interpolation can be achieved.

Furthermore, as an interpolating operation performed in the expanding section 15 of FIG. 14, the convolution of FIG. 16 may be performed based on the digital basic waveform of FIG. 15. In this case, successive interpolation values can be obtained simply by digital processing referred to as convolution. Thus, D/A conversion results in a smooth analog signal. Therefore, it is possible to omit the LPF 17 and to suppress degradation in phase characteristics that is caused by a filter.

(Embodiment 3)

Hereinafter, Embodiment 3 of the present invention will be discussed in accordance with the accompanied drawings.

The above Embodiments 1 and 2 adopt an interpolating method of a variable clock length that uses a table in processing on a time base. In contrast, the following Embodiment 3 can perform compression and expansion more readily without using a table.

In Embodiment 3, first, when an analog signal is inputted as a signal to be compressed, the inputted analog signal is subjected to A/D conversion and is converted to digital data. And then, the digital data undergoing A/D conversion is rounded by using a first value and a second value. A first value may be equal to a second value, but it is more preferable that a second value is larger than a first value.

Further, digital data rounded by the first value is differentiated once on each sampling point, and a point where a differential value changes in polarity is detected as a sample point. Digital data rounded by the second value is obtained as compressed amplitude data of each detected sample point, and timing data indicative of a time interval of sample points is obtained. Further, difference data is obtained as for obtained pieces of the compressed amplitude data, and a pair of the compressed amplitude difference data and timing data is transmitted or recorded as compressed data.

Meanwhile, on an expansion side of compressed data generated thus, compressed amplitude difference data out of compressed data (pair of compressed amplitude difference data and timing data) is oversampled according to a clock having a frequency of even-numbered times. And then, regarding the compressed amplitude difference data that has been subjected to oversampling, a code is reversed at an intermediate position of each section of sample points, the section being indicated by timing data. As for a data string obtained thus, multiple integral is performed on each section of the sample points, and then, a moving average operation or a convoluting operation (convolution) is carried out.

Therefore, it is possible to obtain compressed amplitude data having a smooth waveform, which is divided for the sections of the sample points. Next, the compressed amplitude data obtained thus and the above timing data are used to perform an interpolating operation including multiplication performed by the number of bits rounded by the second value on the compression side. Thus, interpolation data is generated, which smoothly connects pieces of amplitude data of the sections. Further, generated interpolation data is subjected to D/A conversion as necessary to be converted to an analog signal, and the interpolation data is outputted.

Figure 28:
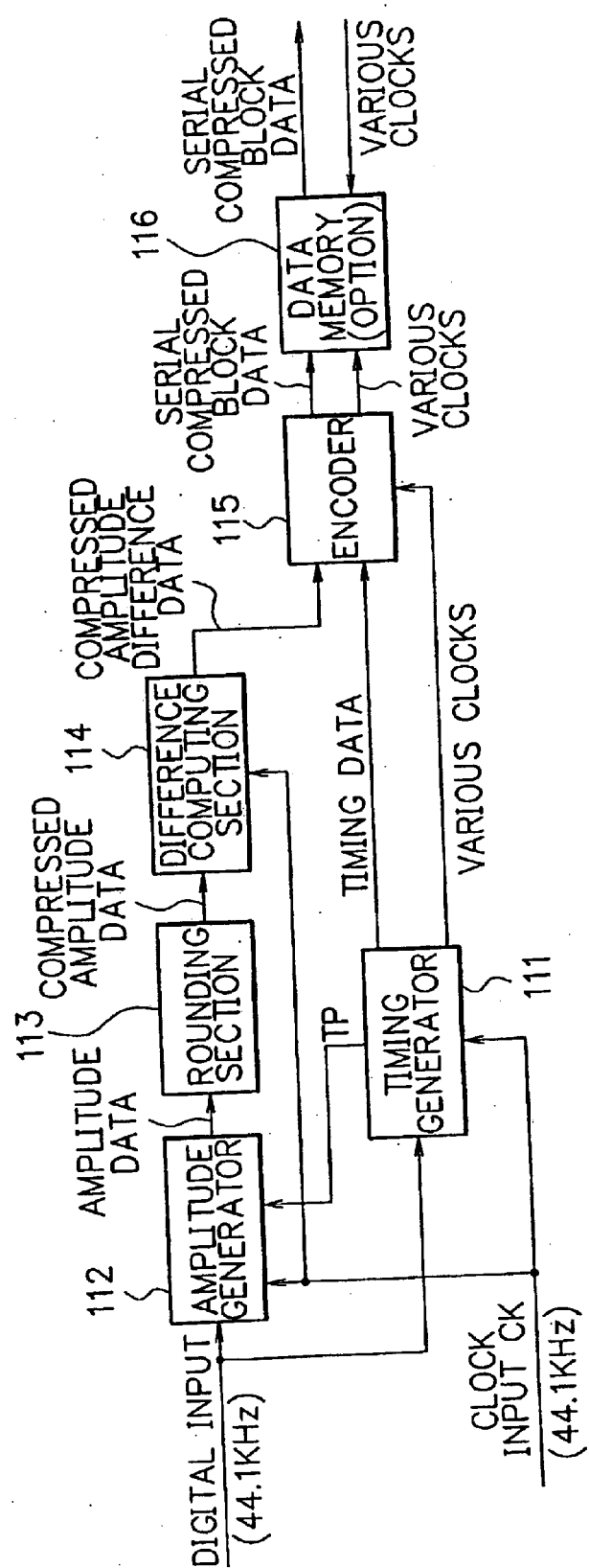
FIG. 28 is a block diagram showing an example of the configuration of a compression apparatus according to Embodiment 3.

FIG. 28 is a block diagram showing an example of the entire configuration of a compression apparatus according to Embodiment 3 for realizing the above compression method.

FIG. 28 shows the case where digital data sampled at a sampling frequency such as 44.1 KHz (reference frequency) is inputted as data to be compressed. The inputted digital data is, for example, signed digital data of 16 bits. Hereinafter, compression of an aural signal will be discussed as an example of digital data.

Besides, although digital data is directly inputted as data to be compressed, an analog signal may be inputted. In this case, an input stage of the compression apparatus is provided with, for example, an LPF and an A/D converter. Namely, in order to readily detect a sample point, an input analog signal is converted to digital data by the A/D converter after noise is removed by the LPF.

As shown in FIG. 28, the compression apparatus of the present embodiment is constituted by a timing generator 111, an amplitude generator 112, a rounding section 113, a difference computing section 114, an encoder 115, and a data memory 116 (option).

The timing generator 111 differentiates inputted digital data for one time on each sampling point, and detects a sample point in response to change in polarity of a differential value. And then, timing pulse TP indicative of timing of the detected point and timing data (the number of clocks CK having a reference frequency) indicative of a time interval between sample points are obtained and outputted. Further, the timing generator 111 also generates and outputs various clocks including a reading clock of the data memory 116.

Moreover, the amplitude generator 112 takes out only digital data on a sample point, which corresponds to timing indicated by timing pulse TP outputted from the timing generator 111, from digital data on each sampling point that is sampled and inputted according to a clock CK having a reference frequency, and the amplitude generator 112 outputs the digital data as amplitude data of each sample point.

Figure 29:
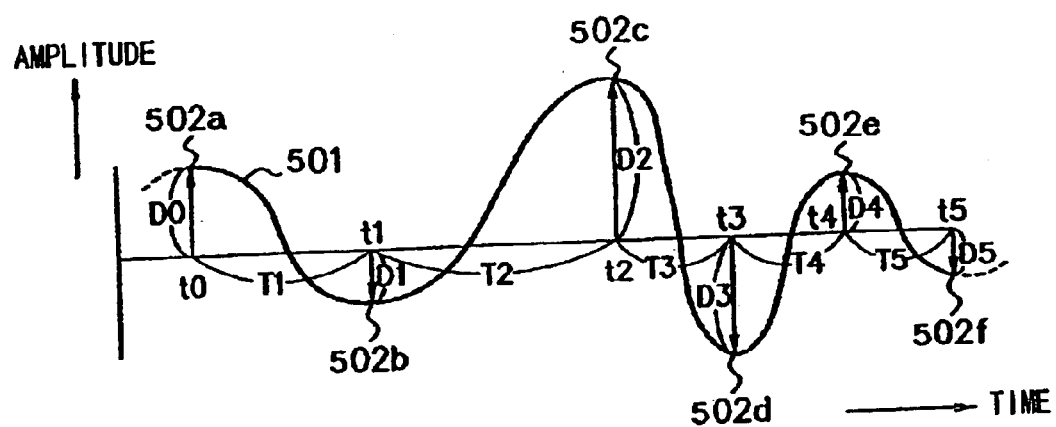
FIG. 29 is a diagram for explaining the operating principles of a timing generator and an amplitude generator of FIG. 28.

FIG. 29 is a diagram for explaining the operating principles of the timing generator 111 and the amplitude generator 112. Here, data inputted to the timing generator 111 and the amplitude generator 112 is digital data. In FIG. 29, a waveform of digital data is shown in an analog manner for explanation.

In the present embodiment, from digital data 501 inputted for compression, points 502a to 502f, on which differential values change in polarity and differential values are 0, are detected as sample points. And then, amplitude data values on the sample points 502a to 502f and timing data values indicative of time intervals of the sample points 502a to 502f are obtained and outputted to the subsequent stage.

In the example of FIG. 29, "D0, D1, D2, D3, D4, and D5" are obtained as digital amplitude data values on the sample points 502a to 502f, and "T1, T2, T3, T4, and T5" are obtained as timing data indicative of time intervals between time t0 and t1, time t1 and t2, time t2 and t3, time t3 and t4, and time t4 and t5, of the sample points 502a to 502f.

At time t0, an amplitude data value "D0" on the sample point 502a is obtained and a timing data value (not shown), which is indicative of a time interval from when a previous sample point (not shown) is detected, is obtained. Thus, a pair of the data values is outputted as data of time t0.

Subsequently, at time t1 when the sample point 502b is detected, a timing data value "T1" is obtained, which is indicative of a time interval from time t0 when the sample point 502a is previously detected, and an amplitude data value "D1" on the sample point 502b is obtained. Thus, a pair of the data values (T1, D1) is outputted as data of time t1.

Further, at time t2 when the sample point 502c is detected, a timing data value "T2" is obtained, which is indicative of a time interval from time t1 when the sample point 502b is previously detected, and an amplitude data value "D2" on the sample point 502c is obtained. Thus, a pair of the data values (T2, D2) is outputted as data of time t2.

In this manner, pairs of (T3, D3), (T4, D4), and (T5, D5) are respectively outputted as data of time t3, t4, and t5. The data include timing data values indicative of time intervals between time t2 and t3, t3 and t4, and t4 and t5, and amplitude data values detected at time t3, t4, and t5 on the sample points 502d, 502e, and 502f.

Figure 30:
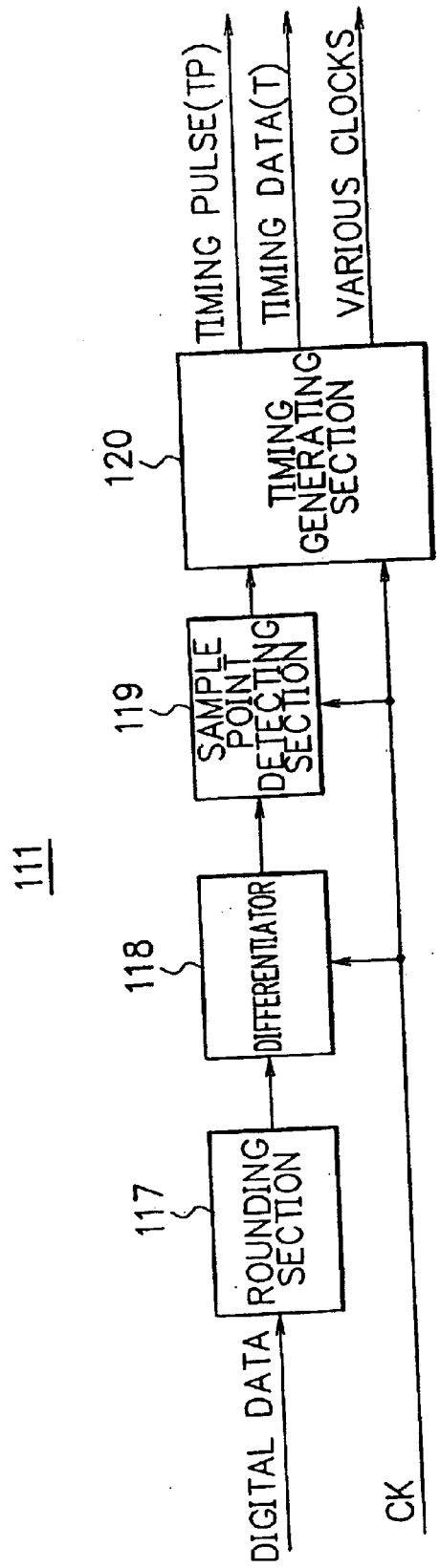
FIG. 30 is a block diagram showing an example of the configuration of the timing generator shown in FIG. 28.

FIG. 30 is a block diagram showing an example of the configuration of the timing generator 111. In FIG. 30, a rounding section 117 rounds digital data, which is inputted as data to be compressed, by using a first value $N_1$ (division using a first value $N_1$). For example, the rounding section 117 rounds inputted digital data by 8 or 16.

A differentiator 118 differentiates digital data, which is rounded by the rounding section 117, for one time. At this moment, the differentiator 118 differentiates digital data every time an input clock CK of 44.1 KHz is supplied, that is, on each sampling point depending on a reference frequency. A differential value is determined by, for example, subtracting current data, which is captured at timing of an input clock CK, from data captured at timing of the previous clock.

Moreover, a sample point detecting section 119 detects as a sample point a point where digital data has a differential value changing in polarity, according to a differential value computed by the differentiator 118. For example, the sample point detecting section 119 detects a point where a differential value changes in polarity from positive to negative or negative to positive and a point where a differential value is 0. And then, regarding a point where a differential value changes in polarity from positive to negative or negative to positive, a point just before polarity changes is detected as a sample point. Meanwhile, regarding a point where a differential value is 0, the point is detected as a sample point. Additionally, when two or more points appear successively with differential values of 0, for example, both ends thereof are detected as sample points.

A timing generating section 120 counts the number of clocks CK supplied from when a sample point is detected to when the subsequent, sample point is detected. The timing generating section 120 outputs the number as timing data T and outputs timing pulse TP indicative of timing of detected points on sample points. Moreover, the timing generating section 120 also generates and outputs various clocks including a reading clock.

As described above, in the present embodiment, before digital data is differentiated to detect a sample point, a rounding operation is performed on the digital data. Although the rounding operation is not always necessary, it is more preferable to perform the operation. Namely, when original data is differentiated without being rounded, small noise components and unnecessary signal components in original data may be detected as sample points, resulting in lower compressibility. Therefore, it is preferable to perform differentiation after the rounding operation.

However, when a first value $N_1$ for rounding is too large, an inflection point (peak point), on which a differential value originally changes in polarity, of original data is flattened and a necessary point may not be detected as a sample point. In this case, correct data cannot be reproduced on the expansion side. For this reason, as a first value $N_1$, it is necessary to select a suitable value, which is not too large or too small (first value $N_1$=8 or 16 is preferable).

Figure 31:
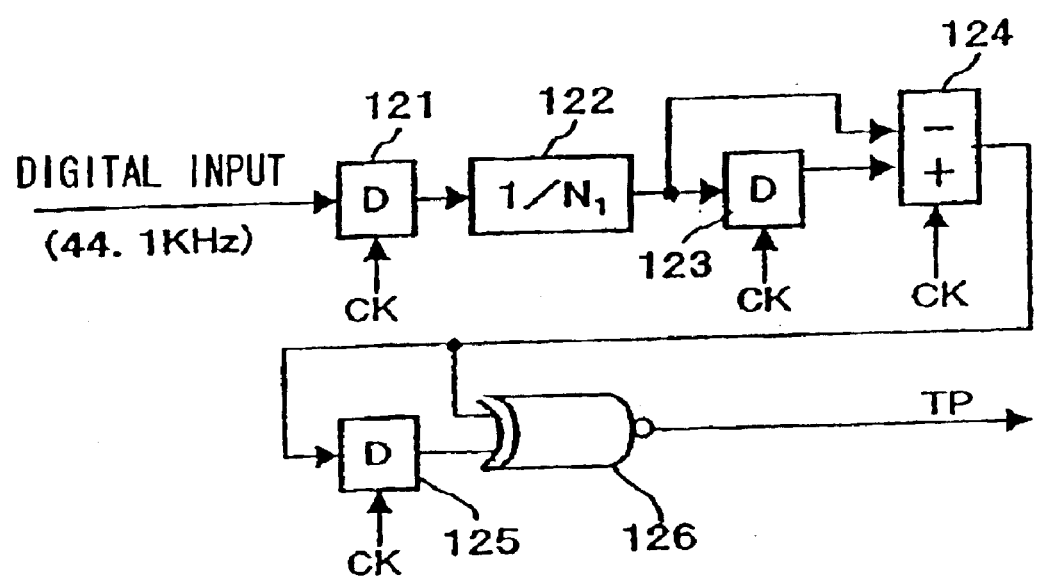
FIG. 31 is a diagram showing a detailed example of the configuration of a part for generating a timing pulse.

FIG. 31 is a diagram showing a detailed example of the configuration of the part for generating the timing pulse TP.

In FIG. 31, a first D-type flip flop 121 samples and stores inputted digital data to be compressed, according to a clock CK having a reference frequency. A multiplier (or divider) 122 multiplies digital data, which is stored in the first D-type flip flop 121, by $1/N_1$.

The digital data multiplied by the multiplier 122 by $1/N_1$ is supplied to the negative side of a subtracter 124, and the digital data is supplied to the positive side of the subtracter 124 after being delayed by a clock CK in a second D-type flip flop 123. Thus, in the subtracter 124, a differential value is determined by subtracting current data captured at timing of an input clock CK from data captured at previous timing.

In the present embodiment, a differential value itself is not necessary and only polarity needs to be determined when a sample point is detected. Hence, only a sign bit of differential data is outputted from the subtracter 124. The sign bit of differential data that is outputted from the subtracter 124 is supplied to one of the input terminals of an EXNOR circuit 126 and is delayed by a clock CK in a third D-type flip flop 125. Thereafter, the bit is supplied to the other input terminal of the EXNOR circuit 126. Hence, the EXNOR circuit 126 detects a sample point where a differential value changes in polarity, and timing pulse TP is outputted as data indicative of the detected point.

The explanation will be continued as follows in accordance with FIG. 28 again. The rounding section 113 rounds amplitude data, which is outputted from the amplitude generator 112, by using a second value $N_2$, which is larger than the first value $N_1$ and outputs compressed amplitude data. For example, the rounding section 113 rounds by 1024 amplitude data of each sample point that is outputted from the amplitude generator 112. Since amplitude data is rounded by 1024, a data length can be shortened by ten bits per word, thereby largely reducing an amount of data.

Further, the difference computing section 114 determines a difference between pieces of compressed amplitude data that are obtained by the rounding section 113. For example, difference data is sequentially obtained by subtracting compressed amplitude data on the previous sample point from compressed amplitude data on a sample point. According to the example of FIG. 29, the difference computing section 114 performs D1/1024−D0/1024, D2/1024−D1/1024, D3/1024−D2/1024, . . . (division by 1024 is a rounding operation of the rounding section 113). Since a difference is computed thus, it is possible to further reduce individual data values as compared with compressed amplitude data before a difference is determined, thereby further shortening a data length.

The encoder 115 forms a block of a pair of timing data, which is determined by the timing generator 111, and compressed amplitude difference data, which is determined by the difference computing section 114, and outputs the pair to a transmission line (not shown) or the data memory 116 as serial compressed block data.

Namely, the encoder 115 forms a block of a pair of compressed amplitude difference data and timing data by parallel/serial conversion, and outputs the data block after adding a header and various flags to the front of the data block. The header includes information such as an identification mark of the header and a value $N_1$ used for rounding of the rounding section 117. An initial value of compressed amplitude data and a data block, which is composed of a pair of compressed amplitude difference data and timing data, follow the above header in ascending order. Here, a rounding value $N_1$ is included in the header because a rounding value $N_1$ is changed to a suitable value for a signal to be compressed.

The data memory 116 is a record medium for storing compressed data. The data memory 116 captures and records serial compressed block data generated by the encoder 115, according to a clock transmitted from the timing generator 111 via the encoder 115. Further, in response to a reading clock supplied from the outside, stored compressed data is read and outputted.

FIG. 32 is a diagram for explaining an example of an actual compression operation performed by the compression apparatus shown in FIG. 28. Here, in FIG. 32, a vertical direction indicates the passage of time from above to below.

Of all data strings A to I of FIG. 32, the data string A on the leftmost side indicates raw data before compression. The raw data is sampled according to a sampling frequency of 44.1 KHz.

The second data string B from the left is the result of rounding raw data by 16 in the rounding section 117 (the multiplier 122 of FIG. 31) of FIG. 30. The third data string C is the result of rounding raw data by 1024 in the rounding section 113 of FIG. 28.

The fourth data string D is the result of differentiating the second data string B (data obtained by rounding raw data by 16) in the differentiator 118 of FIG. 30. For example, the second differential value "24" from above is determined by "696−672" using data of the data string B, and the subsequent differential value "11" is determined by "707−696" using the subsequent data of the data string B.

The fifth data string E is a flag for indicating a point just before a differential value changes in polarity from positive to negative or negative to positive. Namely, "1" is set on a point just before a differential value changes in polarity, and "0" is set on other points. For example, as for differential values on the fourth data string D, on a part where a differential value changes from "11" to "−47", a flag "1" is set on a point of "11" just before a differential value changes in polarity. Further, on a part where a differential value changes from "−15" to "20", a flag "1" is set on a point of "−15" just before a differential value changes in polarity. A point where a flag "1" is set serves as a sample point.

The sixth data string F indicates compressed amplitude data generated by the rounding section 113 of FIG. 28. Here, for understanding of comparison with expansion, which will be discussed later, compressed amplitude data is shown on each point when oversampling is performed at a double frequency.

Actually, compressed amplitude data exists only on a sample point having a flag "1" on the data string E. Compressed amplitude data exists in a similar manner on the following data strings G to I as well.

The seventh data string G is compressed amplitude difference data generated by the difference computing section 114 of FIG. 28. For example, the highest data value "−1" is determined by "10−11" using data values on successive sample points of the data string F, and the subsequent data value "0" is determined by "10−10" using data values on the subsequent successive sample points of the data string F.

The eighth data string H indicates timing data generated by the timing generator 111 of FIG. 28. Here, the number of clocks CK is shown, which are supplied from when a sample point is detected to when the subsequent sample point is detected. On this string as well, timing data is shown on each sampling point having a double frequency. Actually, timing data exists only on sample points having flags "1".

The ninth data string I has a flag showing a separation of data. Namely, when compressed amplitude data has the same values on successive sample points, flag values to "0" and "1" are set to indicate different sample points. For example, a value of compressed amplitude data is "10" both on the second sample point and the third sample point of the data string F. Thus, in order to indicate different sample points having equal compressed amplitude data values, a data separating flag having a different value is set.

Of the above data strings, the encoder 115 forms a block of an initial value "11" of compressed amplitude data shown in the data string F and a pair of (−1,2), (0,1), (−3,3), . . . , which are compressed amplitude differences and timing data on the sample points of the data strings G and H, and the data block is outputted as serial compressed block data.

As described above, according to the compression apparatus of the present embodiment, the raw data to be compressed on the data string A can be substantially compressed to data only on the sample points of the data strings G and H. Additionally, data values on the sample points can be compressed to extremely small values as compared with raw data.

Figure 33A:
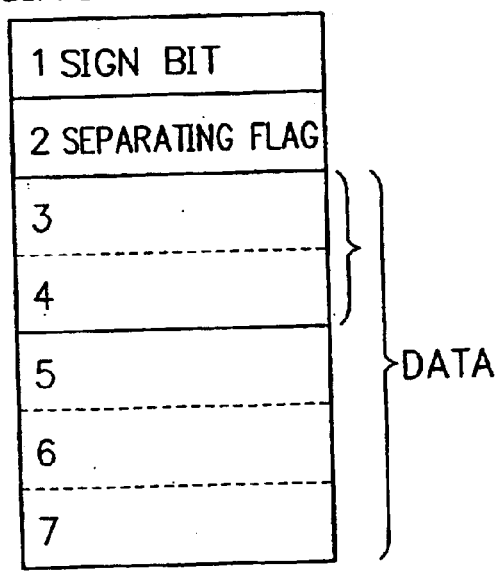
FIGS. 33A and 33B are diagrams showing an example of the configuration of serial compressed block data according to Embodiment 3.
Figure 33B:
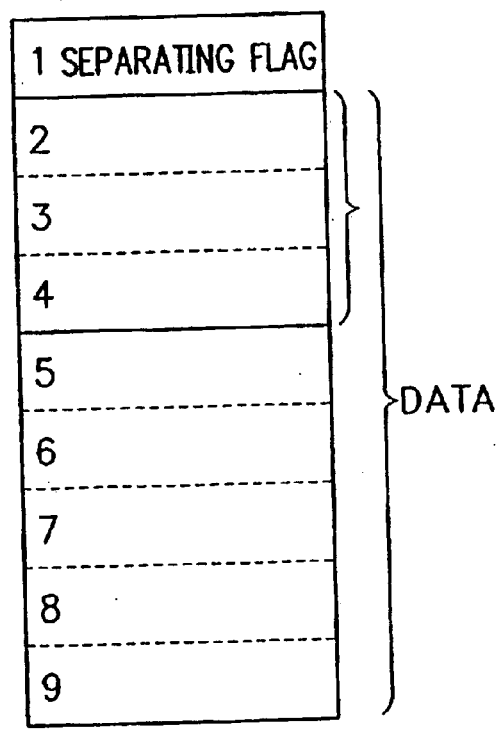

FIGS. 33A and 33B are diagrams showing an example of the configuration of serial compressed block data according to the present embodiment. In the present embodiment, block data is variable-length data as will be discussed below.

FIG. 33A shows a block structure of compressed amplitude difference data. In FIG. 33A, the first bit is a data sign bit (sign bit) indicative of polarity of compressed amplitude difference data. For example, a value "1" of a data sign bit indicates a negative number and a value "0" indicates a positive number.

Further, the second bit is a separating flag indicative of the number of bits of compressed amplitude difference data. For example, when the separating flag has a value of "1", compressed amplitude difference data includes the following two bits (third and fourth bits). When the separating flag has a value of "0", compressed amplitude difference data includes the following five bits (third to seventh bits). In this sense, the separating flag indicates a separating point from the subsequent data block.

As shown in the data string G of FIG. 32, most of compressed amplitude difference data can be represented by two bits except for sign bits. Therefore, the separating flag is set at "1" and a two-bit length is assigned for most of compressed amplitude difference data, and the separating flag is set at "0" and a five-bit length is assigned for compressed amplitude difference data that is not represented by two bits. When five bits are assigned at the maximum, it is possible to represent all of compressed amplitude difference data.

Meanwhile, FIG. 33B shows a block structure of timing data. The blocks of the timing data follow the blocks of the compressed amplitude difference data. In FIG. 33B, the first bit is a separating flag indicative of the number of bits of the timing data. For example, when the separating flag has a value of "1", the timing data includes subsequent three bits (second to fourth bits), and when the separating flag has a value of "0", the timing data includes subsequent eight bits (second to ninth bits).

As shown in the data string H of FIG. 32, timing data is all composed of positive numbers, and most of the data can be represented by three bits. Therefore, the separating flag is set at "1" and a three-bit length is assigned for most of timing data, and the separating flag is set at "0" and an eight-bit length is assigned for timing data not being represented by three bits. When eight bits are assigned at the maximum, all of timing data can be represented.

As described above, in the compression apparatus of the present embodiment, generated compressed data is further transmitted or recorded as variable-length block data. Hence, compressibility can be further increased by about 1.5 times, thereby achieving higher compressibility. For example, compressibility of 12 or more can be achieved for some kinds of music data on CD.

Figure 34:
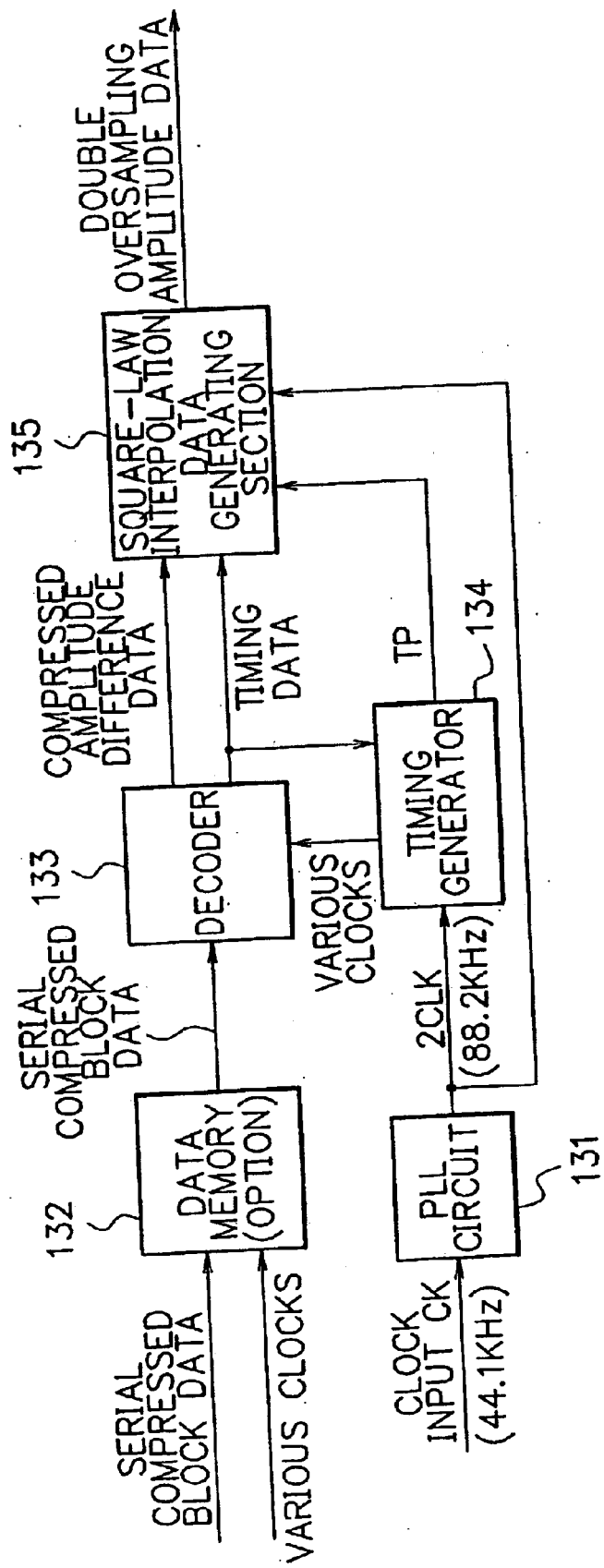
FIG. 34 is a block diagram showing an example of the configuration of an decompression apparatus according to Embodiment 3.

The following will discuss an decompression apparatus for the above-mentioned compression apparatus. FIG. 34 is a block diagram showing an example of the configuration of the decompression apparatus according to the present embodiment. As shown in FIG. 34, the decompression apparatus of the present embodiment is constituted by a PLL (Phase Locked Loop) circuit 131, a data memory (option) 132, a decoder 133, a timing generator 134, and a square-law interpolation data generating section 135.

The PLL circuit 131 generates a clock 2CK having a double frequency (88.2 KHz) from an input clock CK having a reference frequency (44.1 KHz) and supplies the clock 2CK to the timing generator 134 and the square-law interpolation data generating section 135. Moreover, the data memory 132 is a record medium for storing serial compressed block data transmitted from the compression apparatus.

The decoder 133 decodes serial compressed block data, which is read from the data memory 132, by using various clocks synchronized with a clock 2CK having a double frequency, and takes out a pair of compressed amplitude difference data and timing data. And then, the taken compressed amplitude difference data is outputted to the square-law interpolation data generating section 135, and the taken timing data is outputted to the timing generator 134 and the square-law interpolation data generating section 135. Compressed amplitude difference data is synchronized with a frequency between sample points by performing sampling in the square-law interpolation data generating section 135 according to a timing pulse TP.

The timing generator 134 generates a timing pulse TP, which is indicative of a time interval as irregular as sample points detected on the compression side, from an input clock 2CK in response to timing data supplied from the decoder 133. Moreover, the timing generator 134 also generates and outputs various clocks including a reading clock for the data memory 132.

The square-law interpolation data generating section 135 performs a predetermined square-law interpolating operation using compressed amplitude difference data and timing data that are inputted from the decoder 133. Thus, digital interpolation data is generated for connecting sample points. The details of the square-law interpolating operation will be discussed later. Interpolation data generated thus is a series of amplitude data that is generated by performing double oversampling on original data before compression. Digital interpolation data generated thus is outputted as expansion data.

Besides, the example of FIG. 34 shows expansion of digital data. Obtained digital data may be converted to an analog signal as necessary before being outputted. In this case, for example, the output stage of the square-law interpolation data generating section 135 is provided with a D/A converter and an LPF. Namely, after digital interpolation data outputted from the square-law interpolation data generating section 135 is converted to an analog signal by the D/A converter, the signal is outputted as a reproduced analog signal via the LPF.

Figure 35:
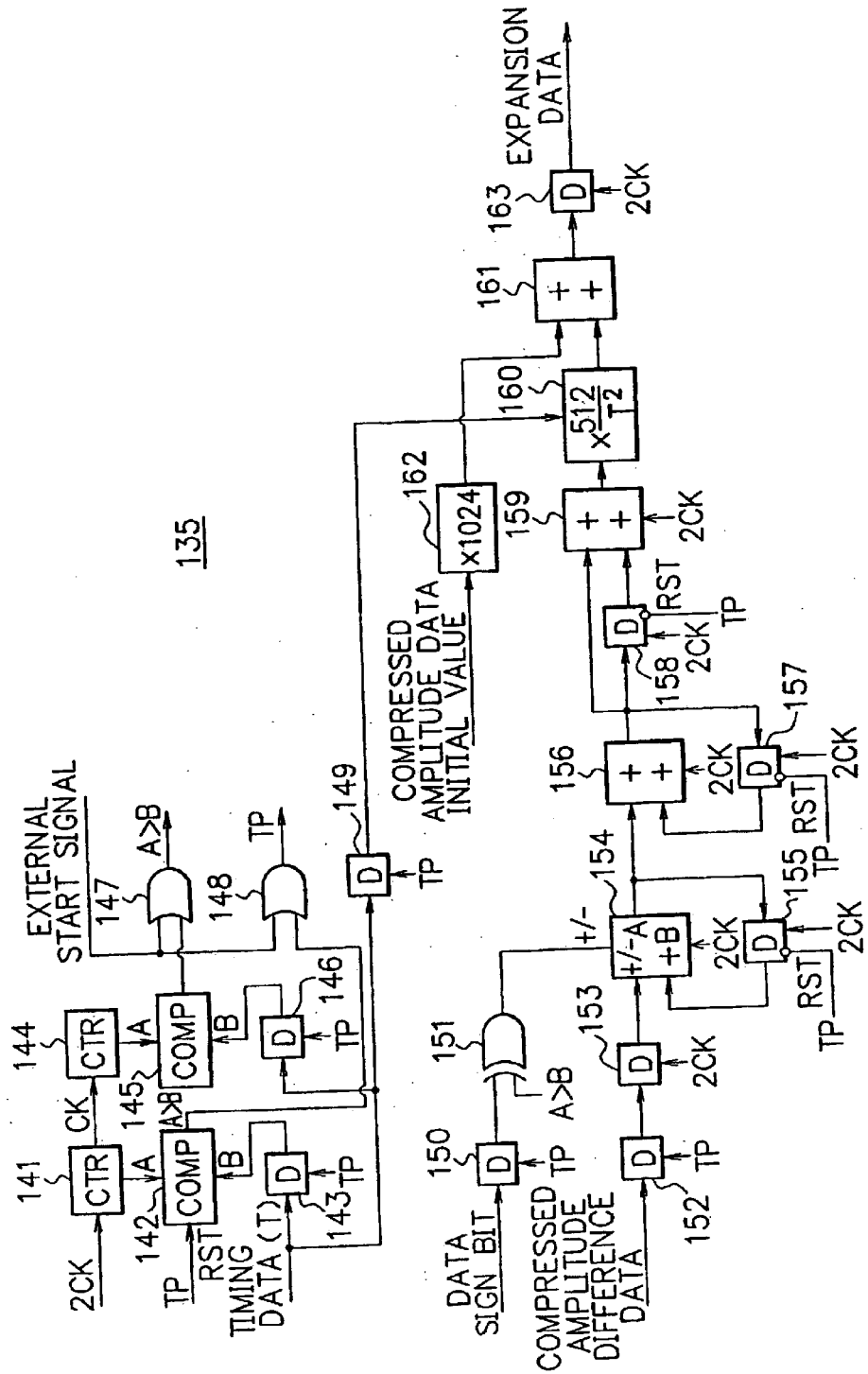
FIG. 35 is a diagram showing a detailed example of the configuration of a square-law interpolation data generating section of FIG. 34.

FIG. 35 is a diagram showing a detailed example of the configuration of the above square-law interpolation data generating section 135. In FIG. 35, timing data (T) inputted as a part of compressed data is stored in three D-type flip flops 143, 146, and 149 according to a timing pulse TP, which is sequentially supplied. Further, a clock 2CK having a double frequency is inputted to the first counter 141 and the number of the clocks is counted sequentially.

A first comparator 142 compares the number of clocks 2CK, which is counted by a first counter 141, and timing data stored in the D-type flip flop 143. And then, every time the number of counted clocks 2CK exceeds a timing data value, the comparator 142 outputs a signal indicative of the state (A>B). A second OR circuit 148 ORs a signal outputted from the first comparator 142 and an external start signal, and outputs the result as a timing pulse TP.

Here, the second OR circuit 148 generates a timing pulse TP because a timing pulse TP needs to be reproduced only by the decompression apparatus. In this case, when the second OR circuit 148 ORs an output signal of the first comparator 142 and an external start signal, a timing pulse TP can be obtained therefrom.

Further, a second counter 144 sequentially counts the number of clocks CK having a reference frequency. A second comparator 145 compares the number of clocks CK, which are counted by the second counter 144, and timing data stored in the D-type flip flop 146. And then, every time the number of counted clocks CK exceeds a value of timing data, the second counter 144 outputs a signal indicative of the state. A first OR circuit 147 ORs a signal outputted from the second comparator 145 and an external start signal, and outputs the result to an EXOR circuit 151.

As described above, when the number of clocks CK according to a reference frequency and the number of clocks 2CK according to a double frequency are each compared with timing data and an OR is determined using signals of the comparison results, a conforming signal (A>B) is outputted from the first OR circuit 147 just at an intermediate position of a time interval between two sample points, the time interval being indicated by timing data (position at a half number of clocks 2CK indicative of the time interval).

Meanwhile, compressed amplitude difference data inputted as a part of compressed data is stored in a D-type flip flop 152 according to a timing pulse TP, which is sequentially supplied. Compressed amplitude difference data stored in the D-type flip flop 152 is supplied to a first adder 154 after being oversampled by a D-type flip flop 153 according to a clock 2CK having a double frequency.

The first adder 154 integrates compressed amplitude difference data by adding compressed amplitude difference data supplied from the D-type flip flop 153 and accumulated data until then that is stored in a D-type flip flop 155.

Upon integration, the first adder 154 reverses a sign of compressed amplitude difference data as necessary, which is inputted from the D-type flip flop 153, according to an output signal from the EXOR circuit 151. In addition to a conforming signal (A>B) outputted from the above first OR circuit 147, a data sign bit (sign bit of FIG. 33), which is stored in the D-type flip flop 152 according to a timing pulse TP, is inputted to the EXOR circuit 151.

Thus, the first adder 154 reverses a sign of compressed amplitude difference data when a data sign bit included in a block data of compressed amplitude difference data or a conforming signal (A>B) from the first OR circuit 147 is reversed in value, that is, on sample points and just at an intermediate position between two sample points.

A first integral value of compressed amplitude difference data that is determined by the first adder 154 is supplied to a second adder 156. The second adder 156 further integrates the first integral value by adding the first integral of compressed amplitude difference data and accumulated data until then. The first integral value is supplied from the first adder 154 and the accumulated data is stored in a D-type flip flop 157.

A second integral value of compressed amplitude difference data that is determined by the second adder 156 is directly inputted to one of the input terminals of a third adder 159 and is inputted to the other input terminal of the third adder 159 after being temporarily stored in a D-type flip flop 158. The third adder 159 carries out a moving average operation (convoluting operation) by adding a second integral value of compressed amplitude difference data and a value obtained by shifting the integral value by a clock 2CK, and the third adder 159 outputs the result to a multiplier 160.

In the three D-type flip flops 155, 157, and 158, a value is reset at 0 every time a timing pulse TP is supplied. The D-type flip flops 155 and 157 constitute integrators of the first and second stages, and the D-type flip flop 158 shifts a second integral value by a clock 2CK. Hence, the second integration and the moving average operation of compressed amplitude difference data are separately carried out in each period of a timing pulse TP (each section between sample points).

The multiplier 160 multiplies a moving average data value, which is determined by the third adder 159, by $512/T^2$ (T represents timing data), and outputs the result to a fourth adder 161. The fourth adder 161 adds a data value from the multiplier 160 and a data value obtained by multiplying an initial value ("11" in the example of FIG. 32) of compressed amplitude data by 1024 in another multiplier 162. And then, data outputted from the fourth adder 161 is outputted as expansion data after being temporarily stored in the D-type flip flop 162 according to a clock 2CK having a double frequency.

With the above configuration, after compressed amplitude difference data is integrated twice, a moving average operation of a first stage is performed and the operation of the following equation (8) is performed on data M of the operating result.

$$(M/2T^2+F)?1024=(M/T^2)?512+F?1024 \tag{8}$$

Here, F represents a current value of compressed amplitude data. Thus, it is possible to realize a circuit for performing oversampling square-law interpolation on sample points having irregular intervals (variable clock) without using a table.

FIG. 36 is a diagram for explaining an example of an actual decompression operation performed by the decompression apparatus of FIG. 34. Here, in FIG. 36, a vertical direction represents the passage of time from above to below.

Of data strings A to G shown in FIG. 36, the data string A on the leftmost side includes data obtained by performing oversampling on compressed amplitude difference data according to a clock 2CK having a double frequency and reversing a sign with a half period of a timing pulse TP. For example, four data values (−1, −1, 1, 1) from above are reversed in sign at an intermediate position of four data values {−1, −1, −1, −1} of the data string G shown in FIG. 32.

The second data string B from the left includes data obtained by integrating compressed amplitude difference data for one time in the first adder 154 of FIG. 35. For example, in the operation on the highest stage, an initial value "0" of the D-type flip flop 155 and a data value "−1" from the D-type flip flop 153 are added up to an accumulated value "−1" of the D-type flip flop 155. In the operation on the second stage, an accumulated value "−1" of the D-type flip flop 155 and a data value "−1" from the D-type flip flop 153 are added up to an accumulated value "−2" of the D-type flip flop 155. The same operation is performed on the third and fourth stages, and the D-type flip flop 155 has accumulated values "−1" and "0" in order.

The third data string C includes data obtained by integrating compressed amplitude difference data twice in the second adder 156 of FIG. 35. For example, in the operation on the highest stage, an initial value "0" of the D-type flip flop 157 and a data value "−1" from the first adder 154 are added up to an accumulated value "−1" of the D-type flip flop 157. In the operation on the second stage, an accumulated value "−1" of the D-type flip flop 157 and a data value "−2" from the first adder 154 are added up to an accumulated value "−3" of the D-type flip flop 157. The same operation is performed on the third and fourth stages, and the D-type flip flop 157 has accumulated values "−4" and "−4" in order.

The fourth data string D includes data obtained by shifting the third data string C by a clock 2CK in the D-type flip flop 158 of FIG. 35. Further, the fifth data string E includes data obtained by adding the third data string C and the fourth data string D in the third adder 159 of FIG. 35.

As described above, until the fifth data string E is obtained, the second integration and the moving average operation are separately carried out in each period of a timing pulse TP (each section between sample points). Namely, the above operations are carried out in each of the sections divided by dotted lines of FIG. 36. Hence, digital waveforms are generated separately in the sections between sample points.

The sixth data string F includes expansion data generated by processing of the multiplier 160 and later of FIG. 35. Namely, since the interpolating operation of equation (8) is performed on a digital waveform obtained thus for each of the sections between sample points, a digital waveform (oversampled interpolation data) is obtained for smoothly connecting digital waveforms of the individual sections.

In the present embodiment, as shown in FIG. 29, inflection points (peak points) of a digital waveform are detected as sample points, data on the sample points is processed as compressed data. Therefore, compressed data includes all minimum data required for reproducing original data by expansion. Hence, data other than inflection points can be smoothly interpolated with 16-bit accuracy by performing square-law interpolation using the compressed data.

Further, in the present embodiment, when double integration is performed on compressed amplitude difference data, compressed amplitude difference data inputted to an integrator (first adder 154) of the first stage is reversed in sign at a half of a period between sample points. Thus, it is possible to obtain a digital waveform with amplitude values changing more smoothly by integration and a moving average operation on the subsequent second stage.

Moreover, in the present embodiment, when an operation such as integration is performed, the D-type flip flop in an integrator and a moving average computing section on each stage are reset in value for each timing pulse TP. Thus, it is possible to accurately conduct the overall algorithm and to eliminate an accumulative error of the integrator, thereby reproducing a more accurate digital waveform.

In this manner, the decompression apparatus of the present embodiment can reproduce original data almost faithfully.

The seventh data string G of FIG. 36 includes data obtained by interpolating original data before compression with a double frequency. As shown in comparison between original data on the data string G before compression and expansion data on the data string F, expansion data generated by the decompression apparatus of the present embodiment has substantially the same values as original data before compression.

Figure 37:
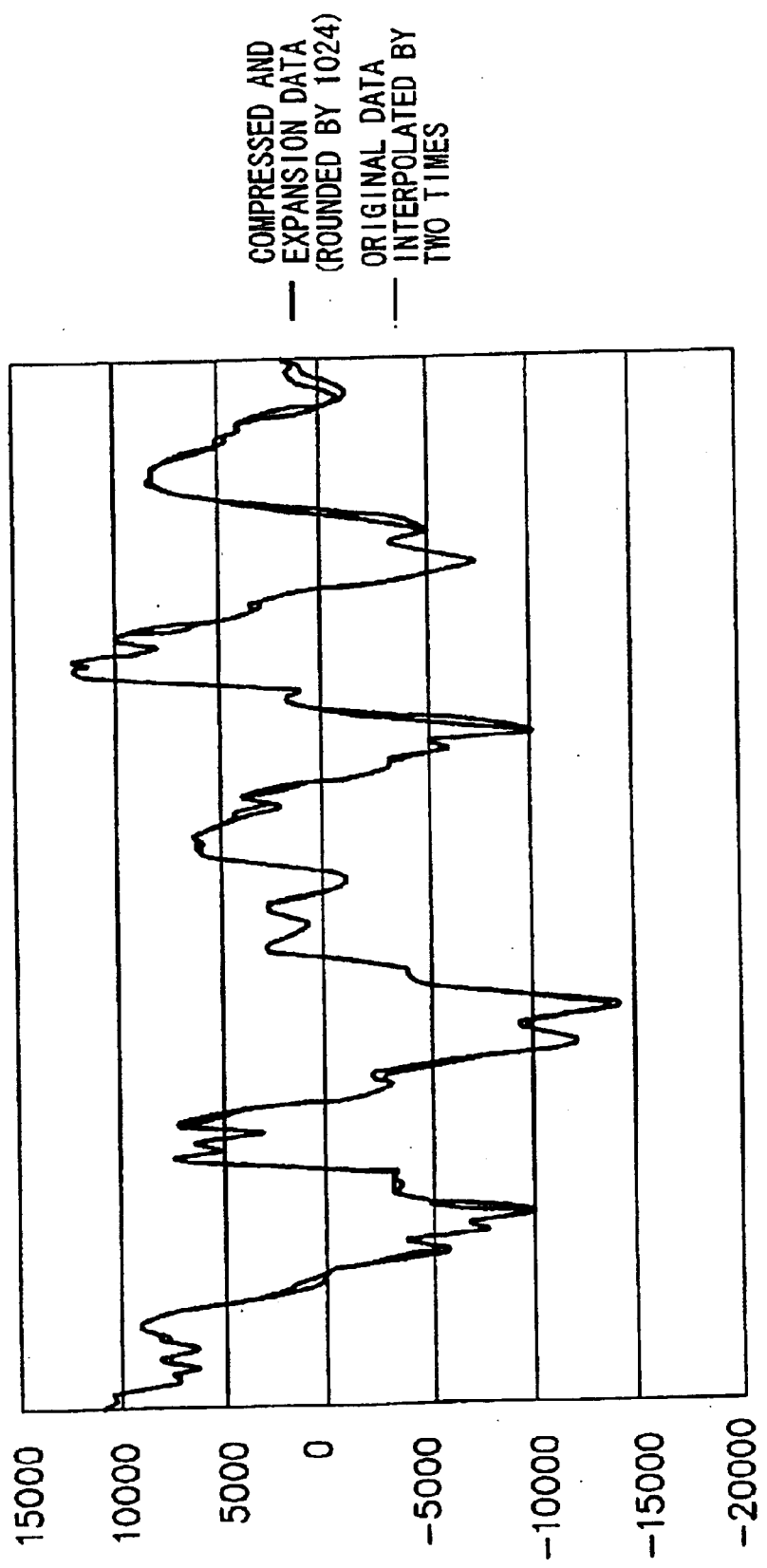
FIG. 37 is a diagram showing an example of original data before compression and expansion data.

FIG. 37 is a graph showing the data strings F and G. As shown in the graph, the decompression apparatus of the present embodiment can reproduce substantially the same data as original data before compression.

As specifically described above, according to the present embodiment, digital data to be compressed can be compressed and expanded directly on a time base without time/frequency conversion. Thus, the operation is not complicated and the configuration can be simplified. Further, without using table information, a simple interpolating operation on a time base can sequentially process and reproduce compressed data to be inputted, thereby realizing real-time operations.

Besides, in the present embodiment, a point where digital data has a differential value changing in polarity is detected as a sample point, compressed data is generated from an amplitude data value on each detected sample point and a timing data value indicative of a time interval of sample points, and the compressed data is transmitted or recorded. Hence, only data on a sample point can be obtained as compressed data, thereby achieving high compressibility.

Further, in the present embodiment, amplitude data on each sample point is not used as compressed data directly but is rounded by 1024. Hence, a data length can be shortened by several bits per word, thereby largely reducing an amount of data. Furthermore, rounded amplitude data is not used as compressed data directly but difference data thereof is obtained and is used as compressed data. Thus, the number of bits required for compressed data can be further reduced, achieving a smaller amount of data.

Additionally, in the present embodiment, obtained compressed amplitude difference data and timing data are encoded to variable-length block data and are used as final compressed data. Therefore, compressibility can be further improved by about 1.5 times, thereby achieving extremely high compressibility.

Further, in the present embodiment, digital data is rounded by a suitable value before a differential value is determined for detecting a sample point. Thus, it is possible to prevent noise components and unnecessary signal components from being detected as sample points and to positively detect only accurate positions as sample points. Moreover, during expansion, on the first stage of a double integrator, addition and subtraction are switched in the first half and the second half of the period of a timing pulse TP. Thus, it is possible to compensate for a rounding error on the expansion side and to reproduce a digital waveform having amplitude values changing more smoothly.

Also, in the present embodiment, when an operation such as double integration is performed together with oversampling, an accumulated value of the integrator on each stage is reset in each timing pulse TP. Hence, it is possible to eliminate an accumulative error of the integrator and to reproduce a more accurate digital waveform. Thus, it is possible to obtain high-quality expansion data close to original data before compression.

As described above, according to the compression and decompression methods of the present embodiment, it is possible to provide new compression and decompression methods for realizing extremely high compressibility and higher quality of reproduced data.

Besides, the above Embodiment 3 describes the example in which the rounding section 113 rounds an amplitude data value by 1024. However, the value is not limited to 1024.

Moreover, although double oversampling is performed in the above Embodiment 3, oversampling is not limited to double as long as it is performed by even-numbered times.

Additionally, in Embodiment 3, during compression, amplitude data on sample points is extracted from digital data inputted to be compressed, and then, the extracted amplitude data is rounded by a second value $N_2$. Compressed amplitude data on sample points may be extracted after inputted digital data is rounded.

Further, in Embodiment 3, during expansion, double integration is performed and a moving average operation of a single stage is performed. Integration is not limited to double and multiple integration is also applicable. Besides, a moving average operation is not limited to a single stage.

A moving average operation or a convoluting operation may be performed with more stages.

Moreover, it is also possible to combine the compression and decompression methods of the above Embodiments 1 to 3 as necessary or to interchange constituent technologies as necessary. For example, Embodiments 1 to 3 describes three different methods of detecting a sample point. Any one of the detecting methods is applicable in the embodiments.

The above-mentioned compression and decompression methods of Embodiments 1 to 3 can be realized by any of hardware, DSP, and software. For example, in the case of software, the compression apparatus and the decompression apparatus of the present embodiments are actually composed of a CPU or MPU, RAM, ROM, and so on of a computer, and the methods are realized by operating programs stored in a RAM and ROM.

Therefore, the methods are realized as follows: programs for operating a computer for achieving the function of the present embodiments are stored in a record medium such as a CD-ROM, and the programs are read by the computer. As a record medium for recording such programs, a floppy disk, a hard disk, a magnetic tape, an optical disk, a magneto-optical disk, a DVD, a nonvolatile memory card, and so on are applicable in addition to a CD-ROM. Further, the methods can also be realized by downloading the programs to a computer via a network such as the Internet.

Further, the computer runs supplied programs to achieve the function of the above embodiments. Additionally, the embodiments of the present invention also include the programs used in the case where the programs realize the function of the above embodiments in coordination with an OS (operating system), which operates in the computer, or other application software and the like, and the case where all or some of the operations of the supplied programs are performed by a function extended board and a function extended unit of the computer to achieve the function of the above embodiments.

Additionally, each of the above-mentioned embodiments merely shows a specific example for realizing the present invention. It should be understood that the present invention is not interpreted within a limited technical range. Namely, the present invention is to cover various forms within the spirit or major characteristics of the invention.

[Industrial Applicability]

The present invention is useful for providing new compression and decompression methods capable of realizing both of extremely high compressibility and higher quality of reproduced data with a simple configuration and in a shorter compression and decompression time.

What is claimed is:

1. A compression method characterized in that a signal to be compressed is sampled at a time interval of a point where a differential absolute value is at a predetermined value or smaller, and a pair of discrete amplitude data on each sample point and timing data indicative of the time interval between sample points is obtained as compressed data.

2. A record medium being capable of computer reading, characterized by recording a program for causing a computer to carry out the steps of said compression method according to in claim 1.

3. A compression method characterized in that a signal to be compressed is oversampled, said oversampled data is sampled at a time interval of a point where a differential absolute value is at a predetermined value or smaller, and a pair of discrete amplitude data on each sample point and timing data indicative of the time interval between sample points is obtained as compressed data.

4. The compression method according to claim 3, said oversampled data is further subjected to an operation for generating average value data of successive sample values.

5. A compression apparatus, comprising:
differentiating means for differentiating digital data to be compressed,
sample point detecting means for detecting a sample point where a differential absolute value determined by said differentiating means is at a predetermined value or smaller, and
compression means for outputting as compressed data a pair of amplitude data on a sample point detected by said sample point detecting means and timing data indicative of a time interval between sample points.

6. The compression apparatus according to claim 5, further comprising A/D converting means for generating said digital data to be compressed by performing A/D conversion on an inputted analog signal.

7. The compression apparatus according to claim 5, further comprising oversampling means for oversampling said digital data to be compressed by using a clock having a frequency of even-numbered times,
said differentiating means differentiates digital data generated by said oversampling means, and said compression means outputs timing data measured according to the clock having said frequency of even-numbered times.

8. The compression apparatus according to claim 7, further comprising average value data generating means for generating average value data of successive sample values for digital data generated by said oversampling means,
said differentiating means differentiates digital data generated by said average value data generating means.

9. An decompression method characterized in that regarding compressed data composed of a pair of amplitude data on predetermined sample points extracted from a signal to be compressed and timing data indicative of a time interval between sample points, amplitude data on successive sample points and timing data therebetween are used to obtain expansion data by determining interpolation data for interpolating pieces of amplitude data having a time interval indicated by said timing data.

10. The decompression method according to claim 9, a sampling function obtained from two pieces of amplitude data on two successive sample points and timing data therebetween is used to obtain interpolation data for interpolating said two pieces of amplitude data.

11. A record medium being capable of computer reading, characterized by recording a program for causing a computer to carry out the steps of said decompression method discussed in claim 9.

12. An decompression apparatus, comprising:
timing control means for controlling timing such that amplitude data on each sample point that is included in compressed data is sequentially captured at each time interval between said sample points according to timing data indicative of a time interval between said sample points extracted from a signal to be compressed, said timing data being included in said compressed data, and
decompression means for obtaining expansion data by determining interpolation data for interpolating two pieces of amplitude data by using said two pieces of amplitude data on two successive sample points and timing data therebetween, said amplitude data being captured under control of said timing control means.

13. The decompression apparatus according to claim 12, said decompression means uses a sampling function obtained from two pieces of amplitude data on said two successive sample points and timing data therebetween so as to obtain interpolation data for interpolating said two pieces of amplitude data.

14. A compression method characterized in that digital data of a basic waveform corresponding to values of inputted n pieces of discrete data is synthesized by oversampling and a moving average operation or a convoluting operation so as to obtain digital interpolation values for said discrete data, and then, said determined digital interpolation values are sampled at a time interval of a point having a minimum differential absolute value, and a pair of discrete amplitude data on sample points and timing data indicative of the time interval between sample points is obtained as compressed data.

15. A record medium being capable of computer reading, characterized by recording a program for causing a computer to carry out the steps of said compression method according to claim 14.

16. A compression apparatus, comprising:

oversampling means for determining a digital interpolation value for discrete data by synthesizing digital data of a basic waveform corresponding to values of inputted n pieces of discrete data by oversampling and a moving average operation or a convoluting operation, differentiating means for differentiating a digital interpolation value determined by said oversampling means, and compressed data generating means for detecting a sample point having a minimum differential value determined by said differentiating means and outputting as compressed data a pair of amplitude data on detected sample points and timing data indicative of a time interval between sample points.

17. The compression apparatus according to claim 16, further comprising rounding means for rounding a lower-order bit of a differential absolute value determined by said differentiating means, said compressed data generating means detects as the sample point a point having a minimum differential absolute value rounded by said rounding means.

18. The compression apparatus according to claim 16, said compressed data generating means detects as the sample point only a point where a differential absolute value is below a fixed value, from points having a minimum differential absolute value determined by said differentiating means or a minimum differential absolute value rounded by said rounding means.

19. The compression apparatus according to claim 16, said oversampling means performs oversampling on the digital data of the basic waveform corresponding to values of said inputted n pieces of discrete data, by using a clock having a frequency of an integral multiple, and said compressed data generating means outputs timing data measured according to the clock having said frequency of the integral multiple.

20. The compression apparatus according to claim 16, said oversampling means comprising;

storing means for storing in advance data obtained by oversampling digital data of said basic waveform, and performing the moving average operation or the convoluting operation on oversampled data of a basic waveform, and synthesizing means for modulating data stored in said storing means to amplitude corresponding to values of said inputted n pieces of discrete data and synthesizes n pieces of data obtained thus by the moving average operation or convoluting operation.

21. A record medium being capable of computer reading, characterized by recording a program for causing a computer to function as said means according to claim 16.

22. A compression/decompression system characterized in that on a compression side, a signal to be compressed is sampled at a time interval of a point where a differential absolute value is at a predetermined value or smaller, and a pair of discrete amplitude data on each sample point and timing data indicative of the time interval between sample points is obtained as compressed data, and on an expansion side, amplitude data and timing data that are included in said compressed data are used to reproduce said amplitude data so as to have the time interval indicated by said timing data, and expansion data is obtained by determining interpolation data based on two pieces of amplitude data on two successive sample points and timing data therebetween, said interpolation data interpolating said two pieces of amplitude data.

23. A compression apparatus, comprising:

oversampling means for determining a digital interpolation value for discrete data by synthesizing digital data of a basic waveform corresponding to values of inputted n pieces of discrete data by oversampling and a moving average operation or a convoluting operation, first differentiating means for determining a differential absolute value by differentiating a digital interpolation value determined by said oversampling means, second differentiating means for determining a double differential value by further differentiating a differential absolute value obtained by said first differentiating means, sample point detecting means for detecting a point where a double differential value determined by said second differentiating means changes in polarity from negative or 0 to positive as a sample point having a minimum differential absolute value determined by said first differentiating means, and compressed data generating means for outputting as compressed data a pair of amplitude data on sample points detected by said sample point detecting means and timing data indicative of a time interval between sample points.

24. The compression apparatus according to claim 23, said sample point detecting means detects as said sample point points where the double differential value determined by said second differentiating means changes in polarity from negative or 0 to positive and the differential absolute value determined by said first differentiating means is below a fixed value.

25. The compression apparatus according to claim 23, further comprising rounding means for rounding a lower-order bit of the differential absolute value determined by said first differentiating means, said second differentiating means further differentiates the differential absolute value rounded by said rounding means.

26. The compression apparatus according to claim 25,
said sample point detecting means detects as said sample point a point where the differential absolute value rounded by said rounding means is below a fixed value, from the points where the double differential value determined by said second differentiating means changes in polarity from negative or 0 to positive.

27. A compression/decompression system characterized in that on a compression side, digital data of a basic waveform corresponding to values of inputted n pieces of discrete data is synthesized by oversampling and a moving average operation or a convoluting operation so as to obtain a digital interpolation value for said discrete data, and then, said obtained digital interpolation value is sampled at a time interval of a point having a minimum differential absolute value, a pair of discrete amplitude data on each sample point and timing data indicative of the time interval between sample points is obtained as compressed data, and on an expansion side, amplitude data and timing data that are included in said compressed data are used to obtain expansion data by determining interpolation data for interpolating two pieces of amplitude data based on said two pieces of amplitude data on two successive sample points and timing data therebetween.

28. The compression/decompression system according to claim 27, oversampling is performed on digital data of the basic waveform corresponding to values of said inputted n pieces of discrete data by using a clock having a frequency of an integral multiple, and timing data is outputted, which is measured according to the clock having said frequency of the integral multiple.

29. The compression/decompression system according to claim 27, a sampling function with a definite base is used to determine interpolation data for interpolating two pieces of amplitude data, said sampling function being obtained from two pieces of amplitude data on said two successive sample points and timing data therebetween.

30. A record medium being capable of computer reading, characterized by recording a program for causing a computer to realize the function of said compression/decompression system according to claim 27.

31. A compression method characterized in that inputted digital data is differentiated, a point where a differential value changes in polarity is detected as a sample point, digital data rounded by a predetermined value is obtained as discrete compressed amplitude data on each sample point, and a pair of compressed amplitude difference data, which is obtained by computing a difference between pieces of said compressed amplitude data, and timing data indicative of a time interval between sample points is obtained as compressed data.

32. The compression method according to claim 31,
inputted digital data is rounded by a first value, digital data rounded by said first value is differentiated, a point where a differential value changes in polarity is detected as a sample point, and digital data rounded by a second value, which is larger than said first value, is obtained as discrete compressed amplitude data on each sample point.

33. The compression method according to claim 31,
said compressed amplitude difference data and said timing data are converted to variable-length block data.

34. The compression method according to claim 33,
a single variable-length block of said compressed amplitude difference data is composed of a sign bit indicative of polarity of said compressed amplitude difference data, a separating flag indicative of a bit length of said compressed amplitude difference data, and said compressed amplitude difference data having a bit length indicated by said separating flag.

35. The compression method according to claim 33,
the single variable-length block of said timing data is composed of a separating flag indicative of a bit length of said timing data, and said timing data having a bit length indicated by said separating flag.

36. A record medium being capable of computer reading, characterized by recording a program for causing a computer to carry out the steps of said compression method according to claim 31.

37. A compression apparatus, comprising:
timing data generating means for differentiating inputted digital data, detecting a point having a differential value changing in polarity as a sample point, and obtaining timing data indicative of a time interval between sample points,
compressed amplitude data generating means for generating data obtained by rounding said inputted digital data by a predetermined value as discrete compressed amplitude data on each sample point detected by said timing data generating means, and
difference computing means for computing a difference between pieces of compressed amplitude data obtained by said compressed amplitude data generating means,
a pair of compressed amplitude difference data obtained by said difference computing means and timing data obtained by said timing data generating means is obtained as compressed data.

38. The compression apparatus according to claim 37, further comprising first rounding means for rounding said inputted digital data by a first value,
said timing data generating means differentiates digital data rounded by said first rounding means and detects as the sample point a point having the differential value changing in polarity, and
said compressed amplitude data generating means generates said compressed amplitude data by rounding said digital data by a second value larger than said first value.

39. The compression apparatus according to claim 37, said compressed amplitude data generating means comprising;
amplitude data extracting means for extracting digital data on each sample point, which is detected by said timing data generating means, as discrete amplitude data, and
second rounding means for rounding amplitude data extracted by said amplitude data extracting means by a second value.

40. The compression apparatus according to claim 37, further comprising encoding means for converting said compressed amplitude difference data and said timing data to variable-length block data.

41. The compression apparatus according to claim 40,
a single variable-length block of said compressed amplitude difference data is composed of a sign bit indicative of polarity of said compressed amplitude difference data, a separating flag indicative of a bit length of said compressed amplitude difference data, and said compressed amplitude difference data having a bit length indicated by said separating flag.

42. The compression apparatus according to claim 40,
a single variable-length block of said timing data is composed of a separating flag indicative of a bit length of said timing data, and said timing data having a bit length indicated by said separating flag.

43. A record medium being capable of computer reading, characterized by recording a program for causing a computer to function as said means according to claim 37.

44. An decompression method characterized in that regarding compressed data composed of a pair of compressed amplitude difference data on predetermined sample points, which are extracted from digital data to be compressed, and timing data indicative of a time interval between sample points, said compressed amplitude difference data oversampled by even-numbered times is subjected to multiple integral, a moving average operation is performed on an integral value, a moving average operating value obtained thus and said timing data are used to obtain as expansion data square-law interpolation data for interpolating pieces of amplitude data on sample points having a time interval indicated by said timing data.

45. The decompression method according to claim 44, said compressed amplitude difference data oversampled by even-numbered times is reversed in sign at an intermediate position of each section between sample points, the section being indicated by the timing data, and data strings obtained thus are subjected to multiple integral.

46. The decompression method according to claim 44, said compressed amplitude difference data oversampled by even-numbered times, multiple integral and the moving average operation are performed in each section between sample points indicated by said timing data.

47. A record medium being capable of computer reading, characterized by recording a program for causing a computer to carry out the steps of said decompression method according to claim 44.

48. An decompression apparatus, regarding compressed data composed of a pair of compressed amplitude difference data on a predetermined sample points extracted from digital data to be compressed and timing data indicative of a time interval between sample points, said decompression apparatus comprising:

integrating means for performing multiple integral on said compressed amplitude difference data oversampled by even-numbered times, moving average computing means for performing moving average operation on an integral value computed by said integrating means, and interpolation data generating means for obtaining square-law interpolation data, which interpolates pieces of amplitude data on sample points having a time interval indicated by said timing data, as expansion data by using a moving average operating value computed by said moving average operating means and said timing data.

49. The decompression apparatus according to claim 48, said integrating means comprises a sign reversing means of reversing a sign of said compressed amplitude difference data over sampled by said even-numbered times at an intermediate position of each section between sample points indicated by said timing data, on a first stage of said multiple integral.

50. The decompression apparatus according to claim 48, said integrating means comprises reset means of resetting an integral value of said compressed amplitude difference data, which is oversampled by said even-numbered times, in each section between sample points indicated by said timing data.

51. The decompression apparatus according to claim 48, said moving average computing means comprises reset means of resetting a moving average operating value of the integral value, which is computed by said integrating means, in each section between sample points indicated by said timing data.

52. A record medium being capable of computer reading, characterized by recording a program for causing a computer to function as said means according to claim 48.

\* \* \* \* \*